(12) United States Patent
Yoshida et al.

(10) Patent No.: US 7,671,417 B2
(45) Date of Patent: Mar. 2, 2010

(54) MEMORY CELL ARRAY, METHOD OF PRODUCING THE SAME, AND SEMICONDUCTOR MEMORY DEVICE USING THE SAME

(75) Inventors: Eiji Yoshida, Kawasaki (JP); Tetsu Tanaka, Kawasaki (JP); Toshihiko Miyashita, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 106 days.

(21) Appl. No.: 11/840,559

(22) Filed: Aug. 17, 2007

(65) Prior Publication Data

US 2007/0278578 A1 Dec. 6, 2007

Related U.S. Application Data

(63) Continuation of application No. PCT/JP2005/002579, filed on Feb. 18, 2005.

(51) Int. Cl.
*H01L 29/72* (2006.01)
(52) U.S. Cl. ............... 257/365; 257/206; 257/315; 257/316; 257/331; 257/401
(58) Field of Classification Search ........... 257/206, 257/315, 316, 331, 365, 401
See application file for complete search history.

(56) References Cited

U.S. PATENT DOCUMENTS

2002/0110018 A1* 8/2002 Ohsawa .................. 365/149

2004/0227248 A1 11/2004 Fukuzumi et al.

FOREIGN PATENT DOCUMENTS

JP 2003-078026 A 3/2003

OTHER PUBLICATIONS

International Search Report of PCT/JP2005/002579, date of mailing May 10, 2005.

* cited by examiner

*Primary Examiner*—Edward Wojciechowicz
(74) *Attorney, Agent, or Firm*—Westerman, Hattori, Daniels & Adrian, LLP

(57) ABSTRACT

A memory cell array includes isolated semiconductor regions formed on a supporting insulating substrate, memory cells formed in the respective semiconductor regions, and insulating regions formed so as to insulate the memory cells. Each memory cell formed in a semiconductor region includes a source region, a drain region, a front gate region formed on a gate insulating film formed on one of side surfaces of the semiconductor region such that the source region and the drain region are separated from each other by the front gate region, and a back gate region formed on a gate insulating film formed on an opposite side surface of the semiconductor region such that the source region and the drain region are separated from each other by the back gate region. Each memory cell shares the back gate region with a memory cell adjacent in a row direction.

14 Claims, 16 Drawing Sheets

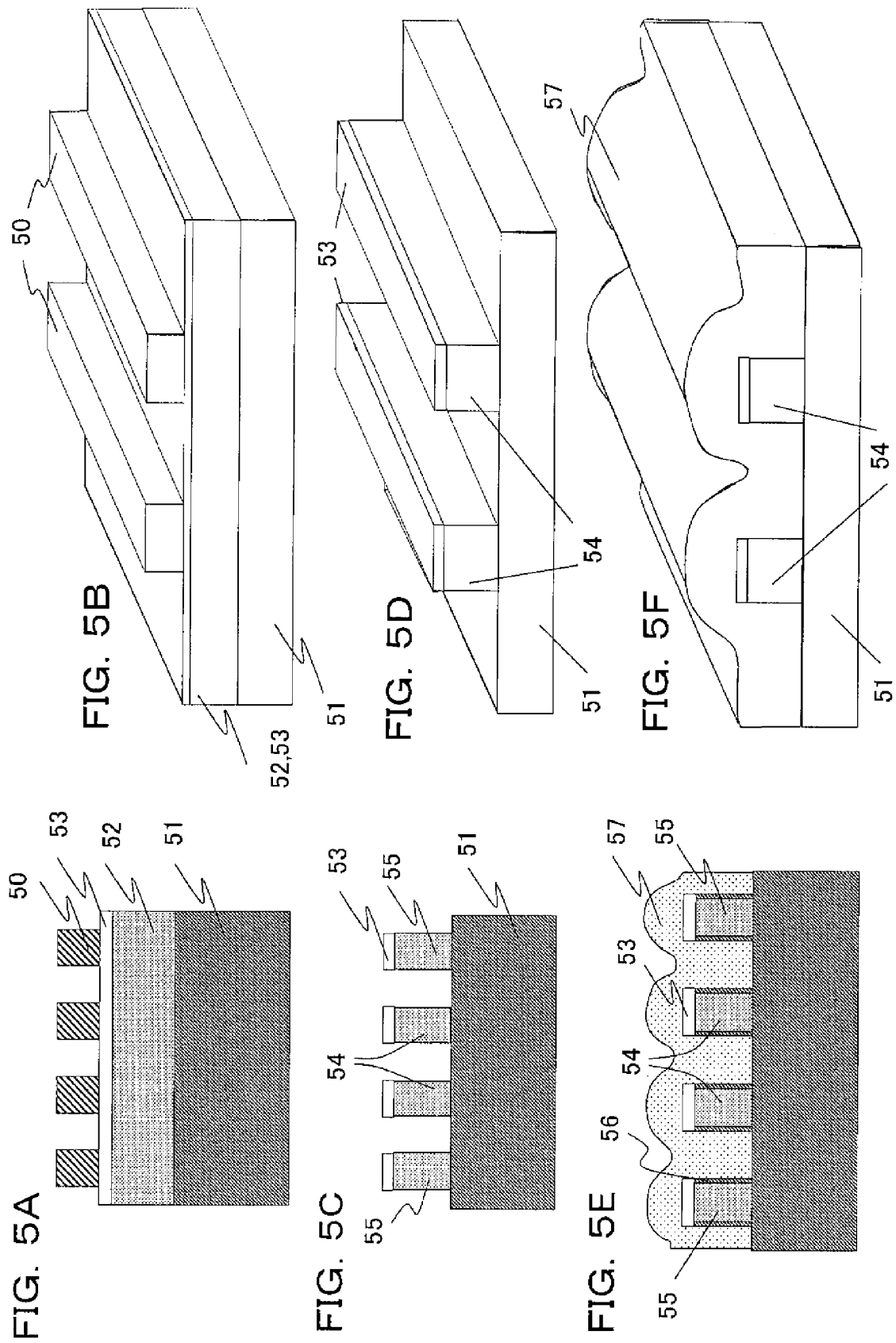

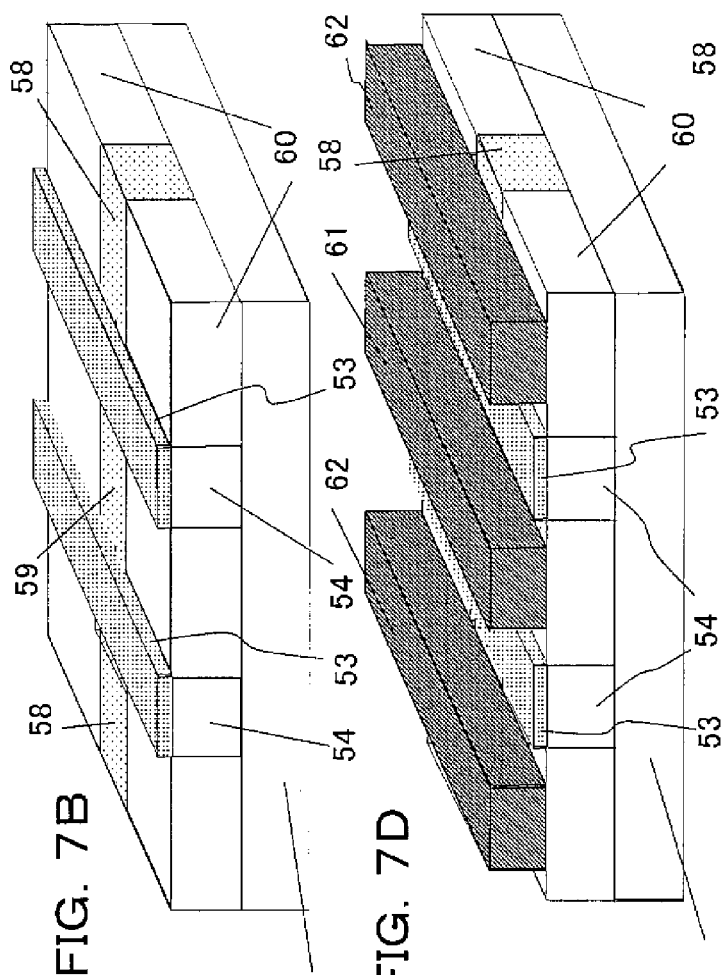
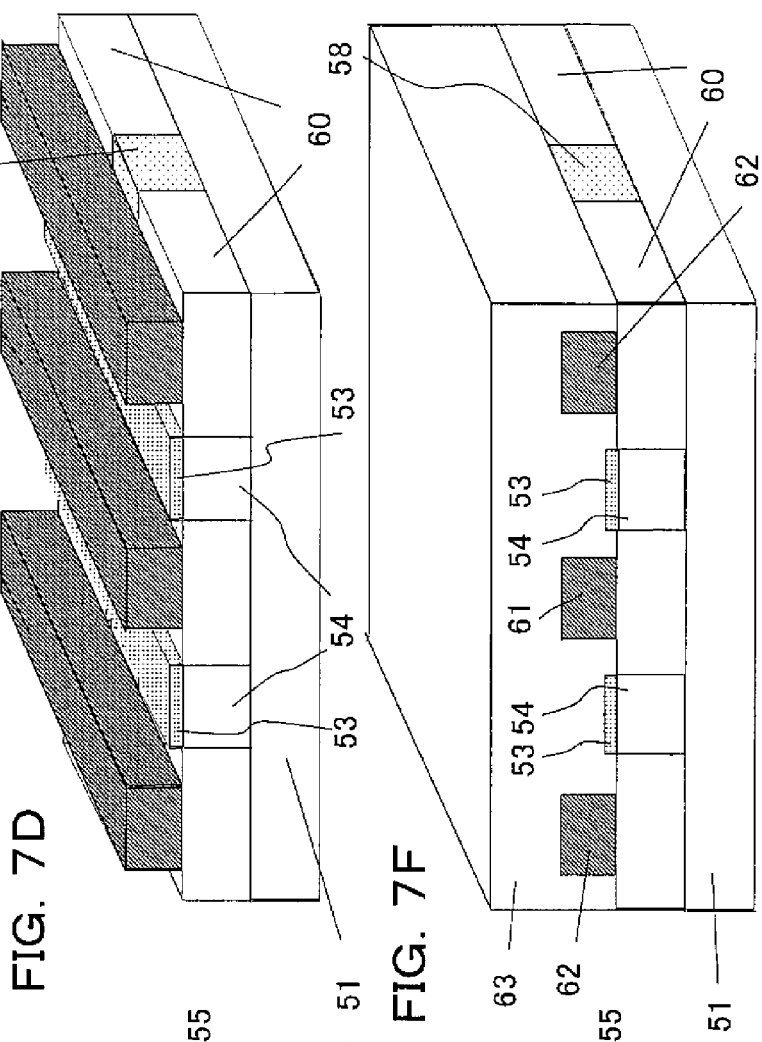
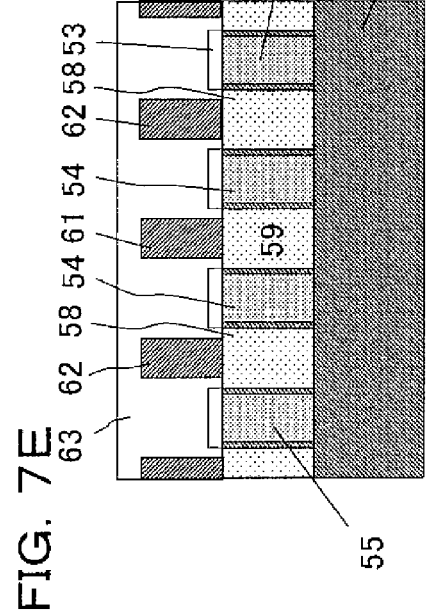

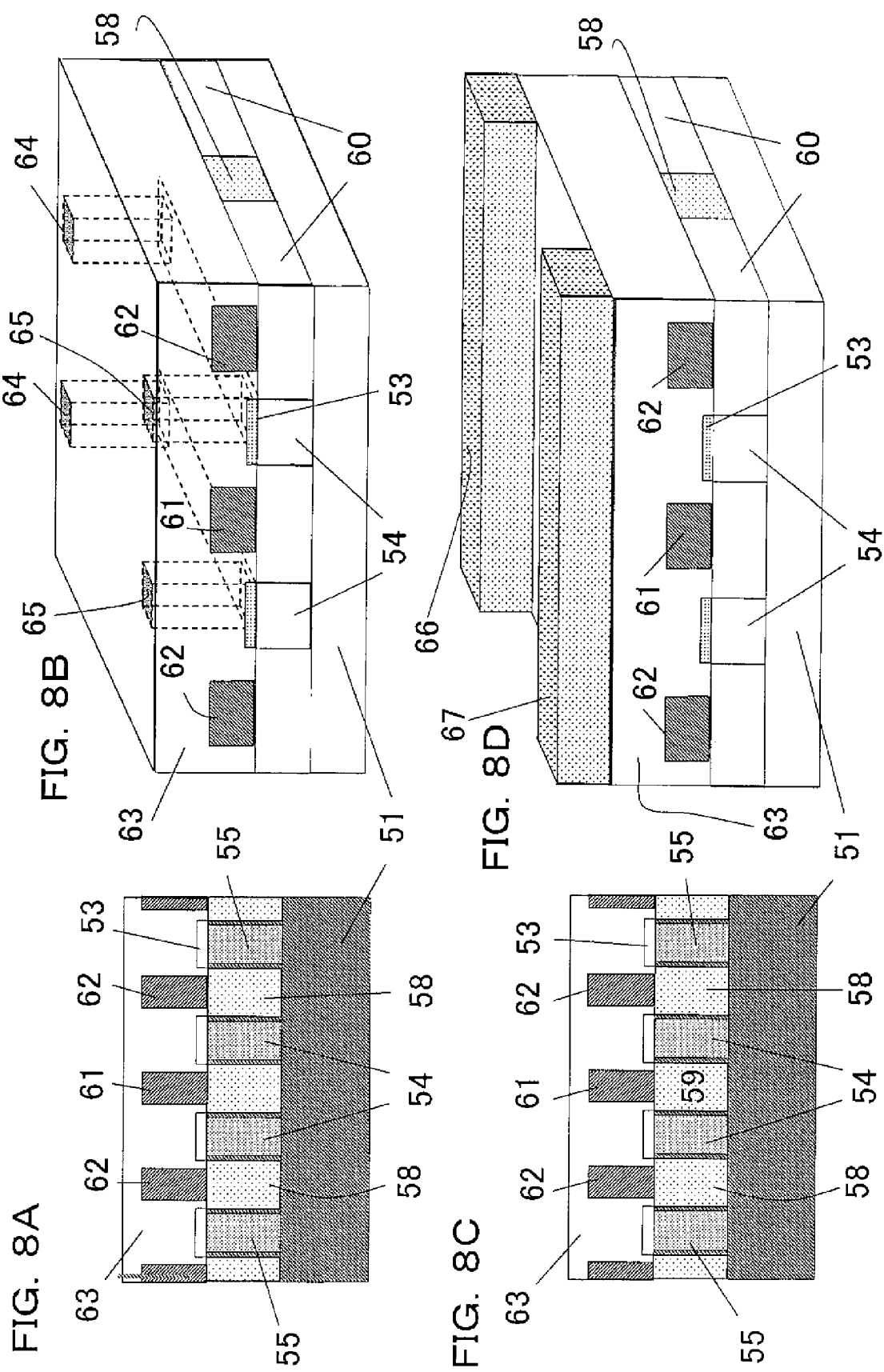

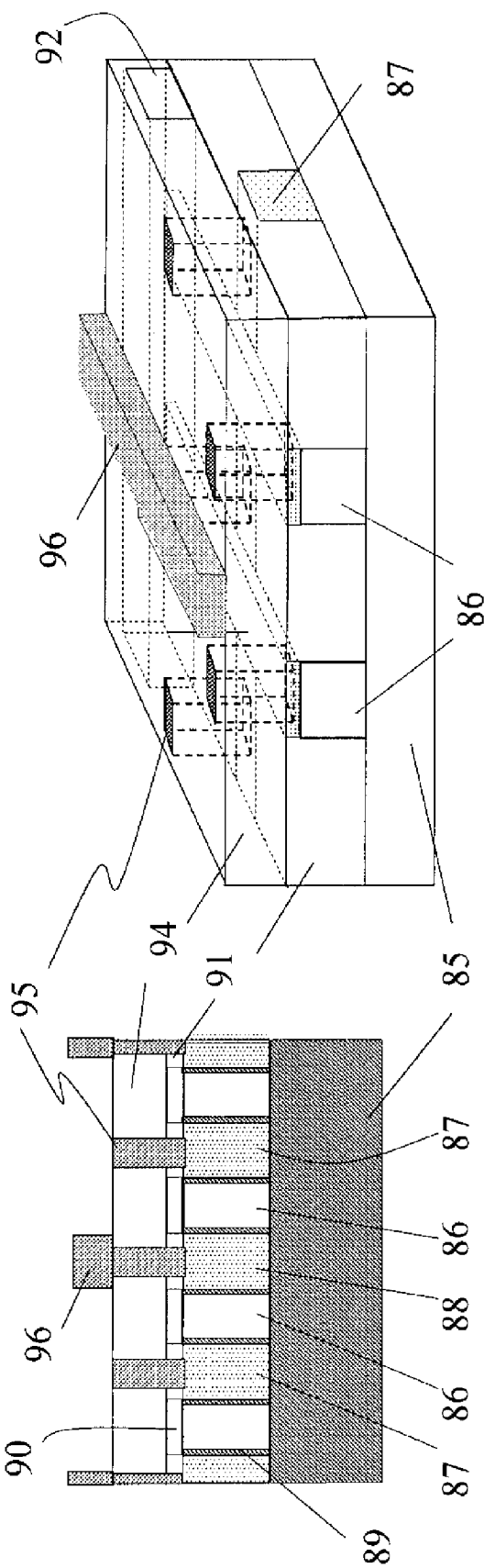
FIG. 11A
FIG. 11B
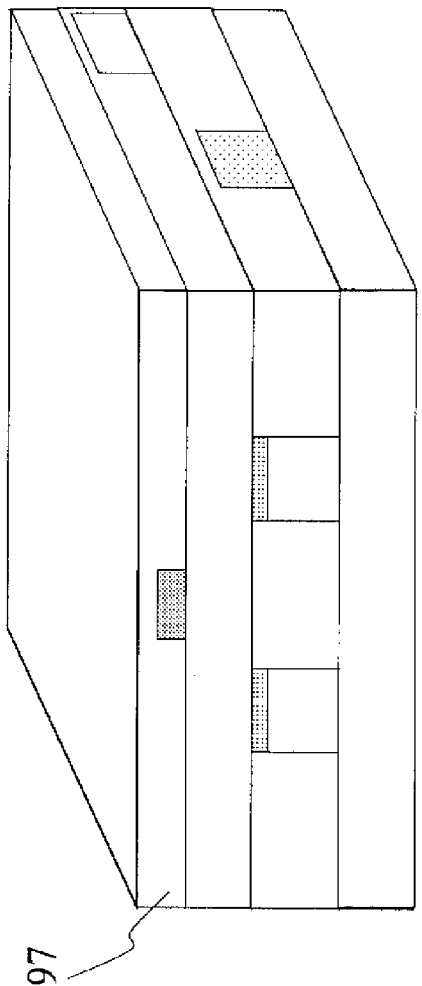
FIG. 11C
FIG. 11D
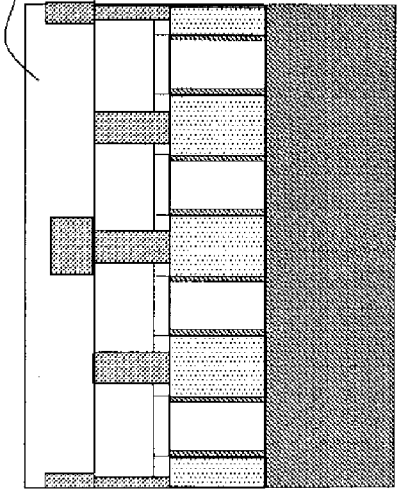

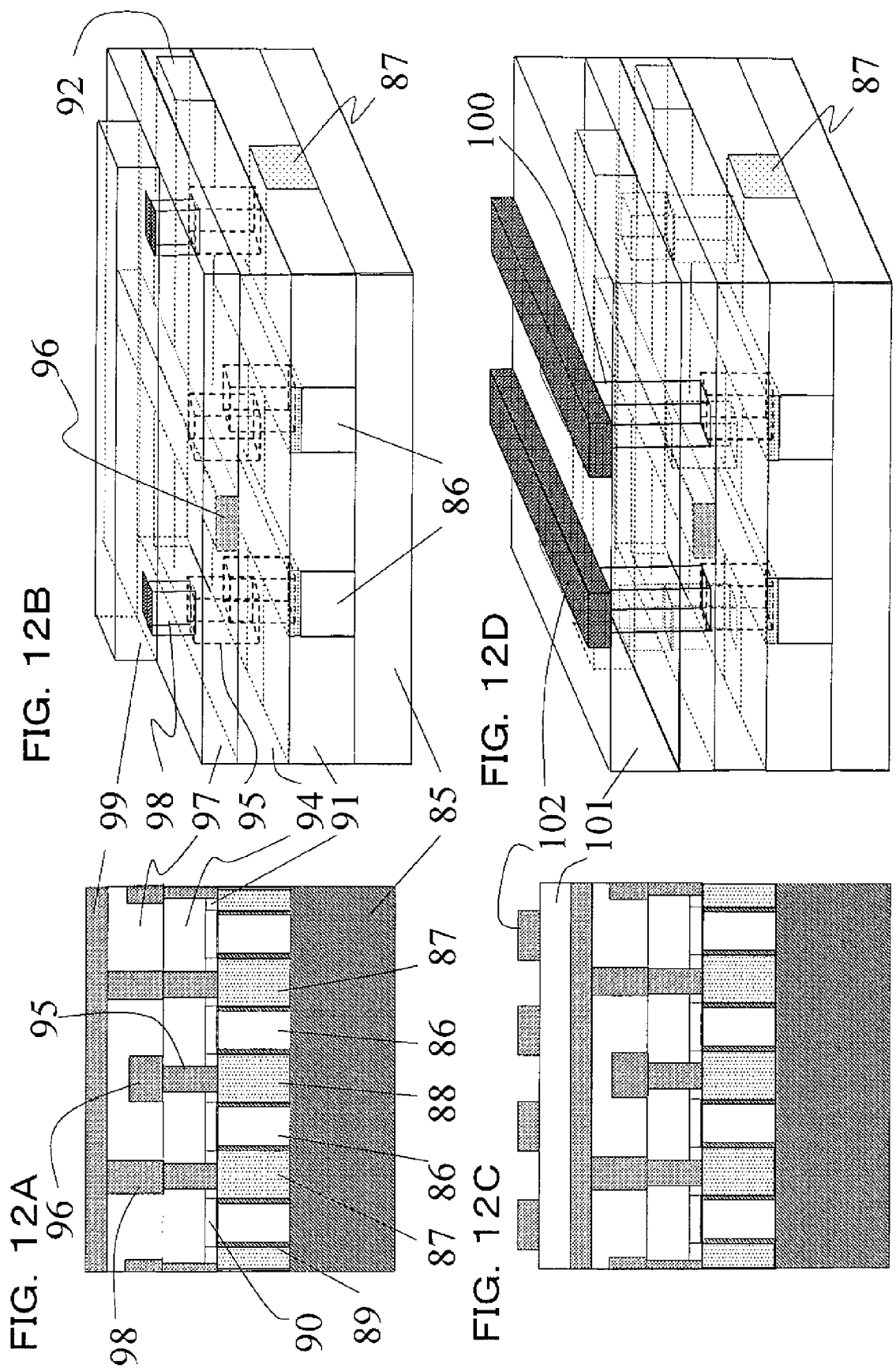

MEMORY CELL ARRAY, METHOD OF PRODUCING THE SAME, AND SEMICONDUCTOR MEMORY DEVICE USING THE SAME

BACKGROUND OF THE INVENTION

1. Field of the Invention

The present invention relates to a memory cell array in which fin-FET memory cells of DRAM are arranged in the form of an array and which is advantageous for use as a memory device embedded in an LSI, a method of producing such a memory cell array, and a semiconductor device using such a memory cell array. More specifically, the present invention relates to a fin-FET memory cell array of DRAM, which can be disposed in a reduced area without causing a problem of multiple selection, a method of producing such a memory cell array, and a semiconductor circuit device using such a memory cell array.

2. Description of the Related Art

State-of-the-art high-density LSIs include a huge number of logic circuits and an embedded memory. In such an LSI, an embedded memory part occupies a large area relative to the total chip area. In order to further increase the integration density of LSIs to meet requirements for improved performance, it is needed to reduce the size of the embedded memory part. In view of the above, much effort has been made to reduce the size of SRAM which is advantageous in compatibility with logic circuits and the size of DRAM which is expected to be capable of being further reduced in size. However, SRAMs have a limit in reduction in size. On the other hand, DRAMs including memory cells each composed of one MOSFET and one capacitor need a complicated production process and is not good in compatibility with the production process of logic circuits. To solve the above problems, it has been proposed to configure a DRAM using memory cells each composed of one vertical double-gate transistor (hereinafter, such a DRAM will be referred to as a "1T-DRAM") (see for example, Japanese Unexamined Patent Application Publication No. 2003-78026).

Logic circuits can also be produced using vertical double-gate transistors. In this case, 1T-DRAMs including memory cells each composed of vertical double-gate transistor have good compatibility with the production process of logic circuits. Compared with conventional DRAMs including memory cells each composed of one MOSFET and one capacitor, 1T-DRAMs including memory cells each composed of one vertical double-gate transistor are expected to be capable of being further reduced in size.

The vertical double-gate transistor refers to a MOSFET configured such that a 3-dimensional isolated region of silicon (Si) is formed on a supporting substrate and a MOSFET having two gate electrodes is formed in this 3-dimensional isolated region of silicon (Si) such that one gate electrode is formed on one side surface thereof and the other one is formed on the opposite side surface. In the vertical double-gate transistor having such a structure, because the channel of the MOSFET is controlled using the two gate electrodes, a reduction in a current flowing between the source and drain in a waiting state can be achieved. Thus, use of the vertical double-gate transistor structure makes it possible to solve problems caused by reduction in size of MOSFETs.

Referring to FIG. 1, a memory cell including a vertical double-gate transistor for use in a 1T-DRAM disclosed in Japanese Unexamined Patent Application Publication No. 2003-78026 is described below.

FIG. 1 shows one of memory cells used in the 1T-DRAM disclosed in Japanese Unexamined Patent Application Publication No. 2003-78026. In FIG. 1, reference numeral 1 denotes a semiconductor region (3-dimensional region of semiconductor), reference numeral 2 denotes a source electrode, reference numeral 3 denotes a gate electrode, reference numeral 4A denotes a first side-surface gate electrode, reference numeral 4B denotes a second side-surface gate electrode, and reference numeral 5 denotes drain electrodes. The source electrode 2 is formed on the top of the semiconductor region 1, and the drain electrodes 5 are formed in regions where the semiconductor region 1 is in contact with a semiconductor substrate, that is, in regions on the bottom of the semiconductor region 1.

When a charge is accumulated in one of the first side-surface gate electrode 4A and the second side-surface gate electrode 4B, the accumulated charge causes a change in the threshold voltage of the vertical double-gate transistor used in the 1T-DRAM. A logical value "0" may be assigned to this state in which the threshold voltage is shifted, and a logical value "1" may be assigned to the other state in which the threshold voltage has a normal value. Thus, it is possible to configure a DRAM in which states of respective cells are detected by detecting the change in threshold voltage.

To use a 1T-DRAM including memory cells composed of vertical double-gate transistors as an embedded memory in a practical LSI, it is needed that memory cells each composed of a vertical double-gate transistor be disposed in the form of an array, and interconnection lines be formed so as to adequately connect drain regions, source regions, first side-surface gate electrode, and second side-surface electrodes.

However, when memory cells each including a vertical double-gate transistor are disposed in the form of an array, the following problems can occur.

When drain regions, source regions, first side-surface gate electrodes, and second side-surface gate electrodes of vertical double-gate transistors in respective memory cells are connected by common interconnection lines extending in row and column directions, it is difficult to connect electrodes located at the bottom of 3-dimensional regions of semiconductor to common interconnection lines such as bit lines or word lines.

In the memory cell array structure, it is required that information written in each memory cell should be retained. If isolation regions are simply disposed between adjacent memory cells to electrically isolate drain regions, source regions, first side-surface electrodes, and second side-surface electrodes of respective memory cells, the result is an increase in the total area of the array, and it is difficult to realize a high-density memory cell array.

In the memory cell array structure, when a voltage is applied to a common interconnection line such as a bit line or a word line to select a particular one of memory cells, there is a possibility that a plurality of memory cells are selected because a plurality of memory cells are activated.

In view of the above, it is an object of the present invention to provide a memory cell array of 1T-DRAM having a high density and having no problem with multiple selection of memory cells, a method of producing such a memory cell array, and a semiconductor circuit device using such a memory cell array.

SUMMARY OF THE INVENTION

In view of the above, in a first aspect of the present invention, there is provided a memory cell array including semiconductor regions disposed on a supporting insulating substrate, memory cells formed in the respective semiconductor regions, and insulating regions formed between adjacent semiconductor regions so as to insulate the memory cells. Each memory cell formed in a corresponding semiconductor region includes a source region disposed on the top surface of the semiconductor region, a drain region disposed on the top surface of the semiconductor region, a front gate region formed on a gate insulating film formed on a first side surface of the semiconductor region such that the source region and the drain region are separated from each other by the front gate region, and a back gate region formed on a gate insulating film formed on a second side surface of the semiconductor region, the second side surface being located opposite to the first side surface, the back gate region being formed such that the source region and the drain region are separated from each other by the back gate region. Each memory cell shares the back gate region with a memory cell adjacent in a first direction.

In a second aspect of the present invention, there is provided a memory cell array including first linear arrays of first semiconductor regions arranged in a column direction on a supporting insulating substrate, memory cells formed on the respective first semiconductor regions, second linear arrays of second semiconductor regions arranged in the column direction on the supporting insulating substrate, insulating regions formed between adjacent first semiconductor regions, between respective first semiconductor regions and respective adjacent second semiconductor regions, and between respective second semiconductor regions so as to insulate the memory cells, front gate lines, back gate lines, bit lines, and source lines. In this memory cell array, two first linear arrays of first semiconductor regions and one second linear array of second semiconductor regions are arranged periodically in a row direction, and each memory cell includes a source region disposed on the top surface of a corresponding first semiconductor region, a drain region disposed on the top surface of the first semiconductor region, a front gate region formed on a gate insulating film formed on a first side surface of the first semiconductor region, the front gate region being located between the first semiconductor region and the second semiconductor region, the front gate region being formed such that the source region and the drain region are separated from each other by the front gate region, and a back gate region formed on a gate insulating film formed on a second side surface of the first semiconductor region, second side surface being located opposite to the first side surface, the back gate region being located between the first semiconductor region and the second semiconductor region, the back gate region being formed such that the source region and the drain region are separated from each other by the back gate region. Each memory cell shares the back gate region with a memory cell adjacent in the row direction. Each front gate line extends in the column direction and connects together the front gate regions of respective memory cells located in one column of the memory cell array. Each back gate line extends in the column direction and connects together back gate regions of respective memory cells located in one column of the memory cell array. Each bit line extends in the row direction and connects together drain regions of respective memory cells located in one row of the memory cell array. Each source line extends in the row direction and connects together source regions of respective memory cells located in one row of the memory cell array.

In a third aspect of the present invention, there is provided a memory cell array including semiconductor regions formed in the shape of a lattice on a supporting insulating substrate, a plurality of memory cells formed in the respective semiconductor regions in the form of an array, insulating regions formed between adjacent semiconductor regions so as to insulate the memory cells, front gate lines, back gate lines, bit lines, and source lines. Each memory cell includes a source region formed on the top surface of a semiconductor region at an intersection of the lattice, a drain region formed on the top surface the semiconductor region at the intersection of the lattice, a front gate region formed on a gate insulating film formed on a first side surface of the semiconductor region such that the source region and the drain region are separated from each other by the front gate region, and a back gate region formed on a gate insulating film formed on a second side surface of the semiconductor region, the second side surface being located opposite to the first side surface, the back gate region being formed such that the source region and the drain region are separated from each other by the back gate region. Each memory cell shares the source region or the drain region with a memory cell adjacent in the column direction. Each memory cell also shares the front gate region or the back gate region with a memory cell adjacent in the row direction. Each front gate line extends in the column direction and connects together front gate regions of memory cells in respective semiconductor regions located in one column. Each back gate line extends in the row direction and connects together hack gate regions of respective memory cells located in one row. Each bit line extends in the column direction and connects together drain regions of memory cells in respective semiconductor regions located in one column. Each source line extends in the row direction and connects together source regions formed on the top of semiconductor regions of respective memory cells located in one row, the source regions being located along a lattice line extending in the row direction.

BRIEF DESCRIPTION OF THE DRAWINGS

FIGS. 5A to 5F show processing steps of producing a memory cell array according to an embodiment of the present invention;

FIGS. 7A to 7F show processing steps of producing a memory cell array according to an embodiment of the present invention;

FIGS. 8A to 8D show processing steps of producing a memory cell array according to an embodiment of the present invention;

FIGS. 11A to 11D show processing steps of producing a memory cell array according to an embodiment of the present invention;

FIGS. 12A to 12D show processing steps of producing a memory cell array according to an embodiment of the present invention;

DESCRIPTION OF THE PREFERRED EMBODIMENTS

The present invention is described in further detail below with reference to specific embodiments.

First Embodiment

Referring to FIGS. 2 to 8, a memory cell array according to a first embodiment of the present invention is described below.

Figure 2:
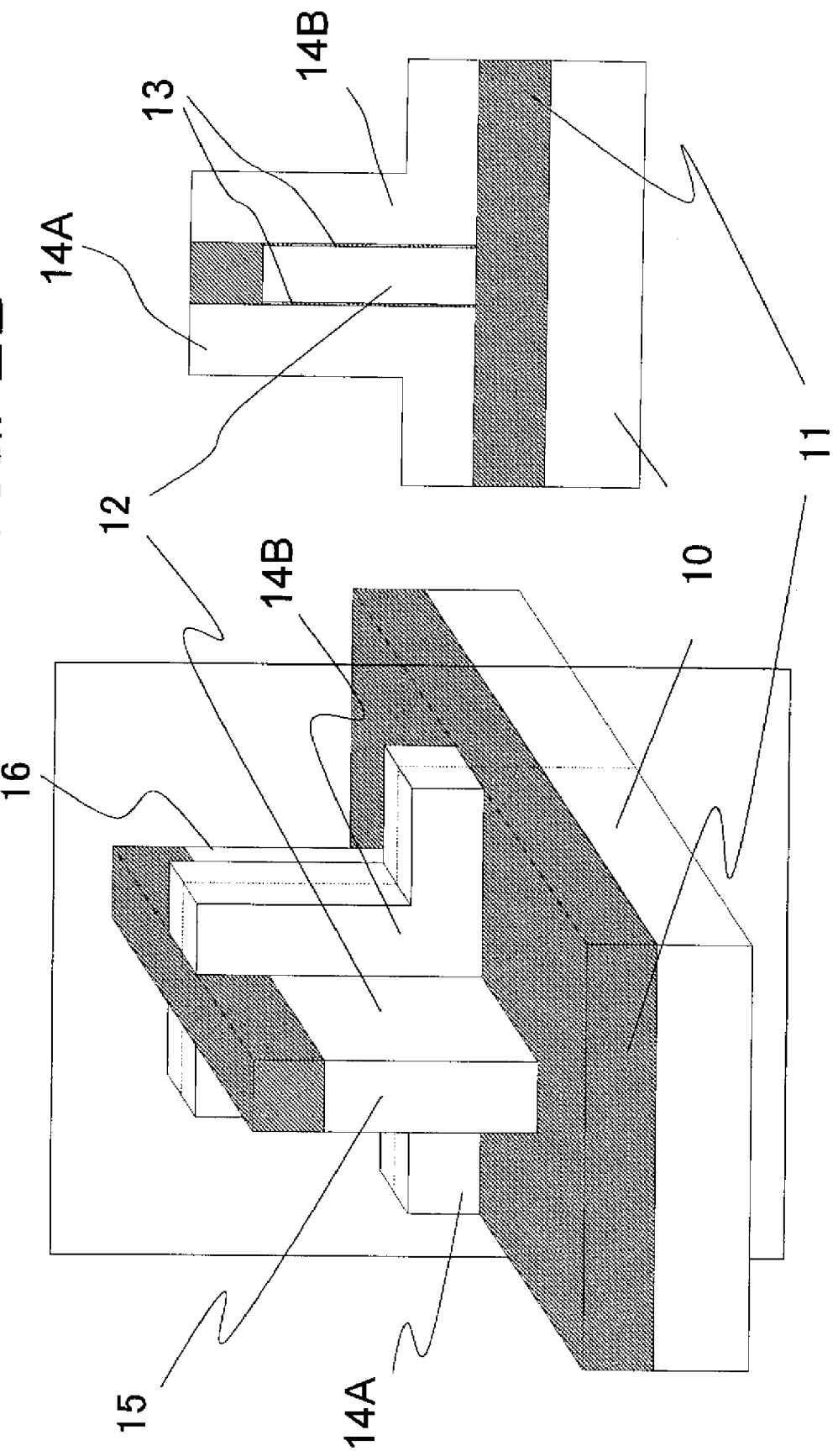
FIGS. 2A and 2B show a memory cell including one MOSFET (Metal Oxide Semiconductor Field Effect Transistor) for use in a DRAM (Dynamic Random Access Memory) of the type called a 1T-DRAM.

FIGS. 2A and 2B show a memory cell including one MOSFET (Metal Oxide Semiconductor Field Effect transistor) for use in a DRAM (Dynamic Random Access Memory) of the type called a 1T-DRAM. FIG. 2A is a perspective of the memory cell, and FIG. 2B is a cross-sectional view of the memory cell, taken along a plane shown in the perspective view of FIG. 2A. The memory cell shown in FIG. 2 is in accordance with the first embodiment of the invention. The memory cell shown in FIG. 2 is based on a memory cell using a fin-FET proposed in Japanese Patent Application No. 2004-141876 filed by the present applicant.

The fin-FET is a MOSFET formed in a 3-dimensional isolated region of a semiconductor formed on an SOI (Silicon On Insulator) substrate used as an insulating substrate. A source region is formed in a region including a first side surface of the 3-dimensional isolated region. A drain region is formed in a region including a second side surface, opposite to the first side surface, of the 3-dimensional isolated region. A gate electrode is formed in a band shape on, via a gate insulating film, a third side surface, a fourth side surface and a top surface of the 3-dimensional isolated region such that the source region and the drain region are separated from each other by the gate electrode.

Thus, a channel of the fin-FET extends in parallel to the supporting substrate.

In FIGS. 2A and 2B, reference numeral 10 denotes a semiconductor part of the SOI (Silicon On Insulator) substrate, reference numeral 11 denotes an insulating layer of the SOI substrate, reference numeral 12 denotes a 3-dimensional region of silicon (Si), reference numeral 13 denotes a gate insulating film, reference numeral 14A denotes a front gate electrode, reference numeral 14B denotes a back gate electrode, reference numeral 15 denotes a source region, and reference numeral 16 denotes a drain region.

The 3-dimensional region 12 of silicon (Si) is formed by etching a silicon layer of the SOI substrate via a rectangular mask pattern by using an anisotropic etching method.

In the memory cell shown in FIGS. 2A and 2B, the source region 15 formed in the 3-dimensional region 12 extends over the first side surface and partially extends on the top surface of the 3-dimensional region 12, and the drain region 16 extends over the second side surface opposite to the first side surface and also partially extends on the top surface of the 3-dimensional region 12. In the memory cell shown in FIG. 2, the front gate electrode 14A is formed, via the gate insulating film, on the third side surface, and the back gate electrode 14B is formed, via the gate insulating film, on the fourth side surface opposite to the third side surface. The source region 15 and the drain region 16 are separated from each other by the front gate electrode 14A and the back gate electrode 14B. As described above, the memory cell shown in FIG. 2 is configured so as to have a so-called fin-FET structure.

In a usual fin-FET structure, the gate electrode is formed in the shape of a single continuous band extending over the two side surfaces and across the top surface. Thus, structure of the memory cell shown in FIG. 2 is different from the structure of the usual fin-FET in that the gate electrode of the memory cell shown in FIG. 2 includes two parts, that is, the front gate electrode and the back gate electrode, which are disposed separately. The source region and the drain region are similar in structure to those of the usual fin-FET.

Figure 1:
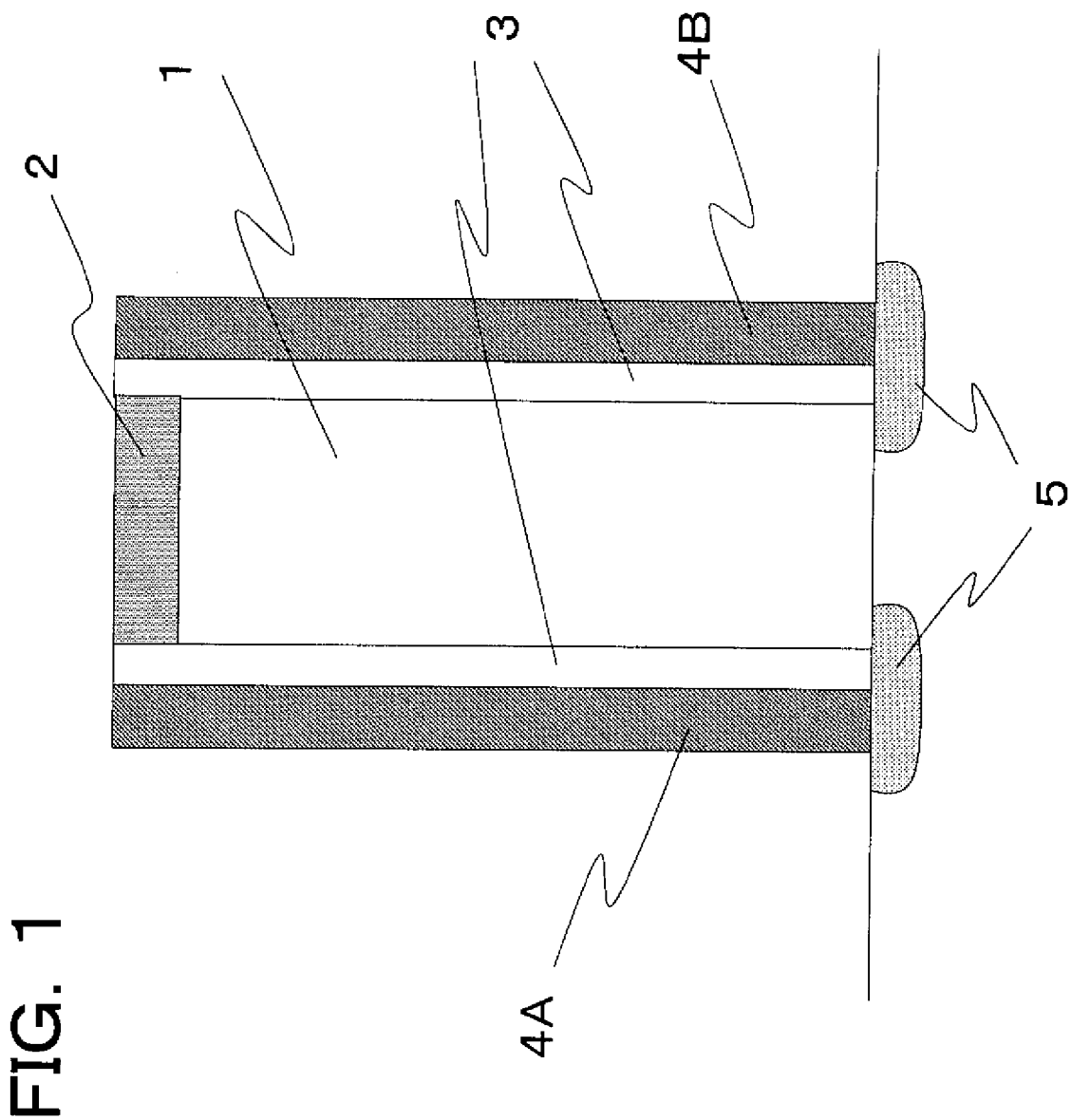
FIG. 1 is a diagram showing a memory cell of a 1T-DRAM disclosed in Japanese Unexamined Patent Application Publication No. 2003-78026.

Unlike the double gate transistor shown in FIG. 1 in which the drain electrode is formed in the bottom of a semiconductor region, the memory cell shown in FIG. 2 is configured such that each of the source region 15 and the drain region 16 includes a portion partially extending on the top surface of the 3-dimensional region 12. This structure of the memory cell shown in FIG. 2 makes it possible to easily connect an interconnection line to the source region 15 or the drain region 16 by using the portions located on the top surface of the 3-dimensional region 12.

Figure 3:
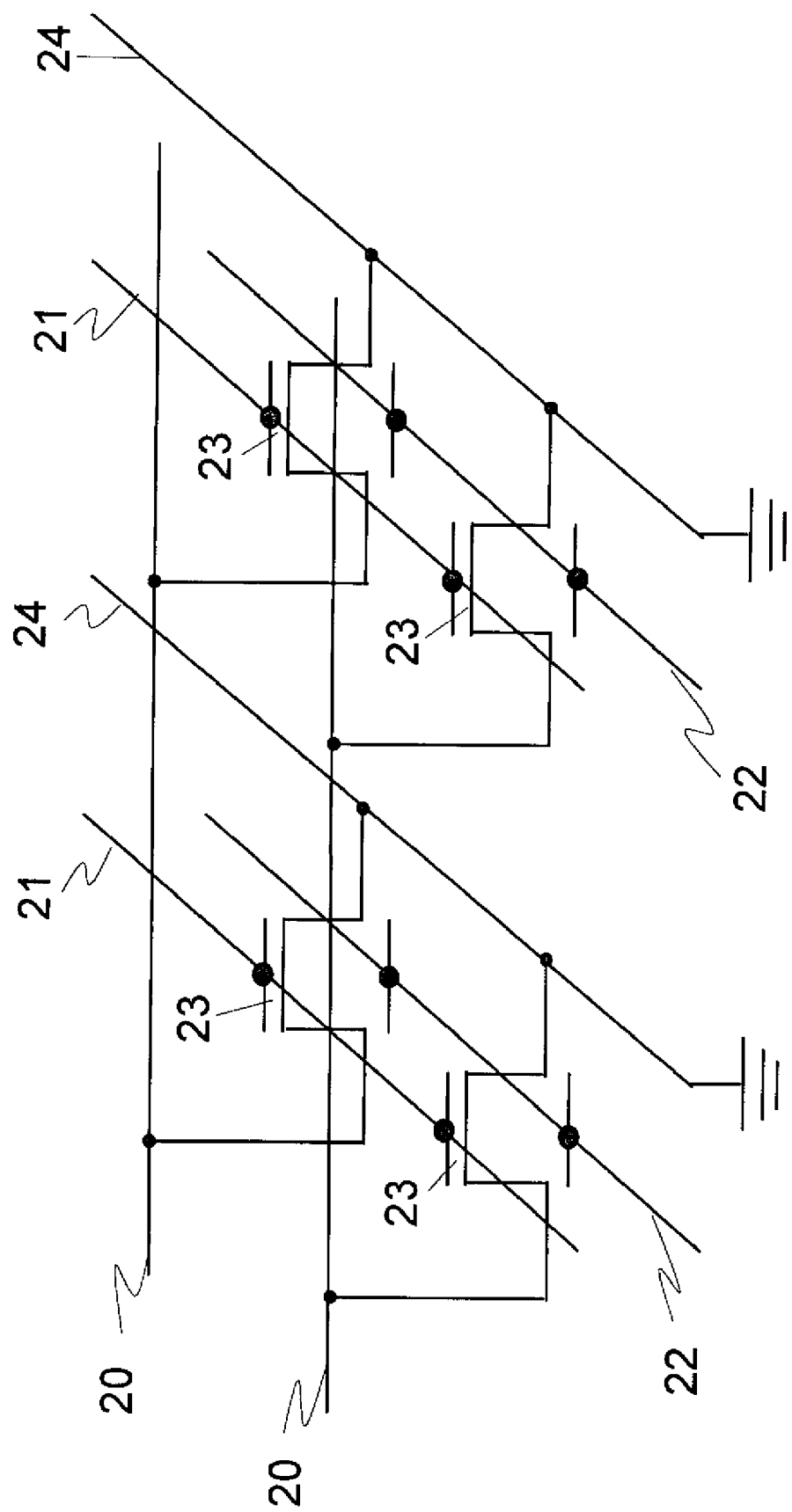
FIG. 3 is a circuit diagram of a memory cell array including an array of memory cells each of which is similar the memory cell shown in FIGS. 2A and 2B.

FIG. 3 is a circuit diagram of a memory cell array including an array of memory cells each of which is similar the memory cell shown in FIG. 2.

In FIG. 3, reference numerals 20 denote bit lines (hereinafter, referred to as BL lines), reference numerals 21 denote common front gate lines (hereinafter, referred to as FG lines), reference numerals 22 denote common back gate lines (hereinafter, referred to as BG lines), reference numerals 23 denote memory cells, and reference numerals 24 denote source lines (hereinafter, referred to as SL lines).

Each memory cell 23 is similar to the memory cell shown in FIG. 2. Each memory cell 23 is denoted by the same symbol as that widely used to represent a MOSFET because the memory cell 23 has a fin-FET structure composed of a source region, a drain region, and a gate electrode as with the MOSFET. The memory cell 23 having the fin-FET structure operates in a similar manner to the MOSFET in that conduction between the source region and the drain region of the memory cell 23 is controlled by a voltage applied to the gate electrode of the memory cell 23. However, the memory cell 23 is different from the usual fin-FET in that the gate electrode of the memory cell 23 includes two parts, that is, the front gate region and the back gate region, and the memory cell 23 operates such that the channel between the source region and the drain region is turned on when a voltage is applied to either one of the front gate region and the back gate region. The memory cell 23 is also different from the usual fin-FET in that when a negative voltage is applied to one of the two parts of the gate electrode, for example, the back gate region, holes which are carriers of electricity are accumulated in a region close to the back gate region whereby the conduction of the memory cell 23 is controlled depending on whether holes are accumulated or not.

When the memory cell 23 is in a state in which holes are accumulated in the region close to the back gate region and thus the memory cell 23 has a high conductivity, the memory cell 23 is said to be in state "1". When the memory cell 23 is in a state in which no holes are accumulated in the region close to the back gate region and thus the memory cell 23 has a low conductivity, the memory cell 23 is said to be in state "0". Although the memory cell 23 includes only one fin-FET, the memory cell 23 is capable of store data, that is, the memory cell 23 functions as one element of a 1T-DRAM.

Each BL line 20 connects together the drain regions of respective memory cells 23 along a row. Each FG line 21 connects together the front gate regions of respective memory cells 23 along a column. Each BG line 22 connects together the back gate regions of respective memory cells 23 along a column. Each SL line 24 connects together the source regions of respective memory cells 23 along a column. Each SL line 24 is connected to a fixed voltage line such as a ground line.

To write information in a particular memory cell 23, the particular memory cell 23 is activated via a selected FG line 21 and a selected BL line 20, and a BG line connected to this activated memory cell 23 is selected. Thereafter, the voltages of the selected BL line 20, FG line 21, and BG line 22 are set depending on a desired state into which the memory cell 23 is to be set. As a result, the memory cell 23 is set into the desired state. For example, if writing is performed by setting the BG line to 0 V, the memory cell 23 is set into the state "0" in which the memory cell 23 has a low conductivity. On the other hand, if the writing is performed by setting the BG line to a negative voltage, the memory cell 23 is set into the state "1" in which the memory cell 23 has a high conductivity. When the writing is completed, the BG line is maintained at a negative voltage to retain the written state.

To read information from a particular memory cell 23, the memory cell 23 is activated by selecting a corresponding FG line 21 and a corresponding BL line 20 while maintaining the BG line at the negative voltage. If the activated memory cell 23 has a high conductivity, the voltage of the BL line 20 becomes lower than a reference voltage of the BL lines 20. On the other hand, when the activated memory cell 23 has a low conductivity, the voltage of the BL line 20 becomes higher than the reference voltage of the BL lines 20. Thus, by comparing the voltage of the selected BL line 20 with the reference voltage of the BL lines 20, it is possible to determine whether the memory cell 23 is in the state "1" or "0". Note that when the memory cell is activated to read information stored in the memory cell, the memory cell is brought into the same state as that in which "1" is written, because the BG line is at the negative voltage. However, in practice, because the voltage applied to the BL line 20 is much lower than that in the writing operation, writing is not actually occurs during the reading operation.

In the memory cell array obtained by arranging memory cells shown in FIG. 2 in the form of an array, one memory cell is selected by activating two common lines, that is, one FG line and one BL line as shown in FIG. 3. Therefore, in each memory cell shown in FIG. 2, it is desirable that the regions connected to common lines, such as the front gate region connected to the FG line and the source region connected to the BL line, be electrically isolated from the corresponding regions of adjacent memory cells. For example, when an FG line is selected, if front gate regions of two or more memory cells in the same column are activated, a plurality of memory cells are incorrectly selected.

In view of the above, if memory cells and device isolation regions are disposed in a direction along rows such that a device isolation region, a front gate region, a fin region, and a back gate region are periodically disposed in this order, then electrical isolation between each front gate region and an adjacent back gate region is achieved. On the other hand, in the direction along columns, if memory cells and device isolation regions are disposed such that a device isolation region, a drain region (connected to a BL line) on a fin region, a front gate region and a back gate region, a source region (connected to a SL line) on a fin region, a front gate region and a back gate region, and a drain region (connected to a BL line) on a fin region are disposed periodically in this order, electrical isolation of drain regions is achieved. Note that one source region is shared by two memory cells adjacent in the column direction. This is because the source electrode is connected to a corresponding SL line maintained at the fixed voltage and the source electrode does not have any contribution to selection of a memory cell, and thus it is not necessary to electrically isolate source regions between memory cells.

The device isolation regions, the front gate regions and the back gate regions, the source regions, the drain regions, and the fin regions can be formed such that each of these regions have a width equal to a minimum line width (referred to as a fine pitch F) defined in a photolithographic process used. Thus, in the row direction, respective regions appear periodically at intervals equal to 4 F, that is, a repetition pitch in the row direction is equal to 4 F. In the column direction, the same pattern appears periodically at intervals equal to 6 F, that is, the repetition pitch in the column direction is equal to 6 F. Thus, memory cells for two bits are formed in an area with a size of $4 F \times 6 F = 24 F^2$. In other words, the area needed to form a memory cell of one bit is $12 F^2$.

Figure 4A:
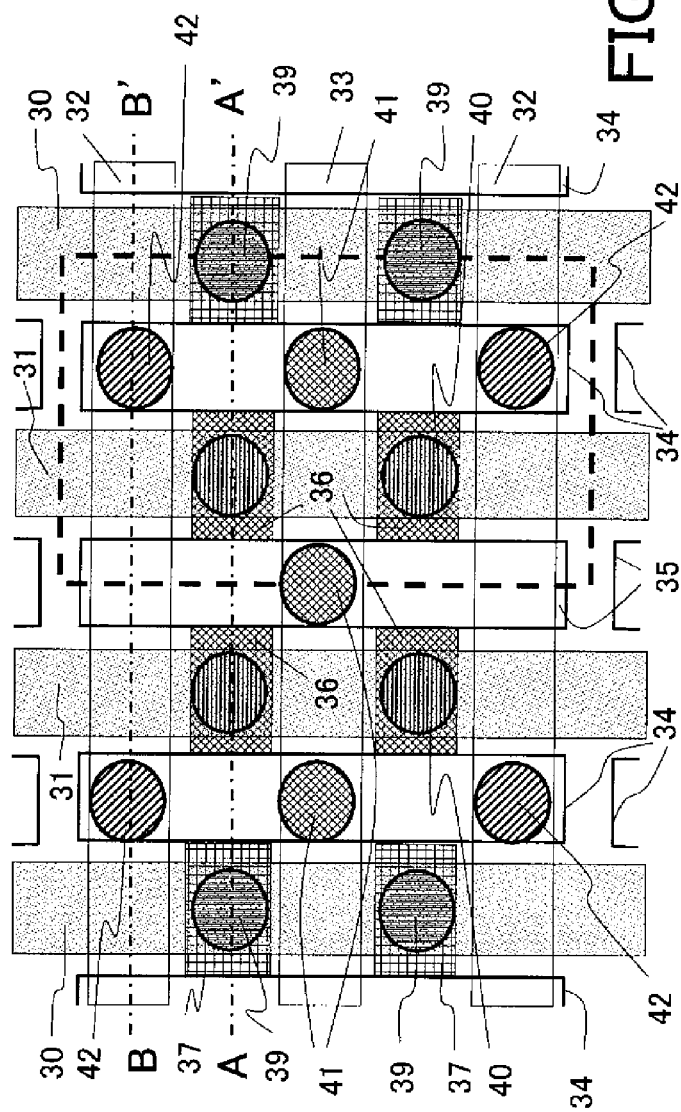
FIG. 4A is a plan view.
Figure 4C:
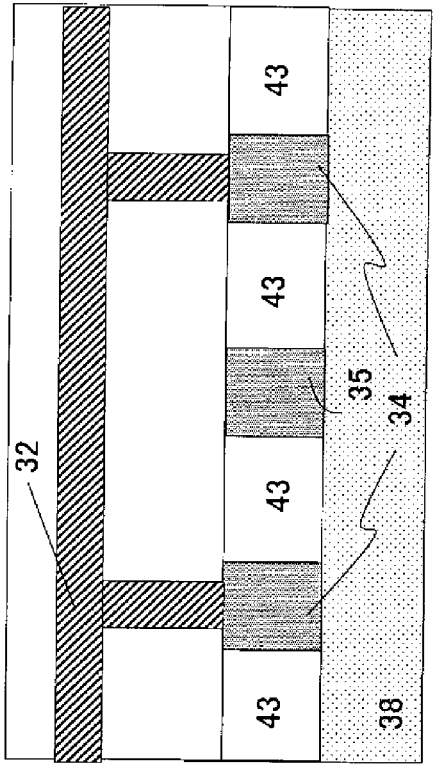
FIG. 4C is another cross-sectional view, showing a memory cell array according to an embodiment of the present invention.
Figure 4B:
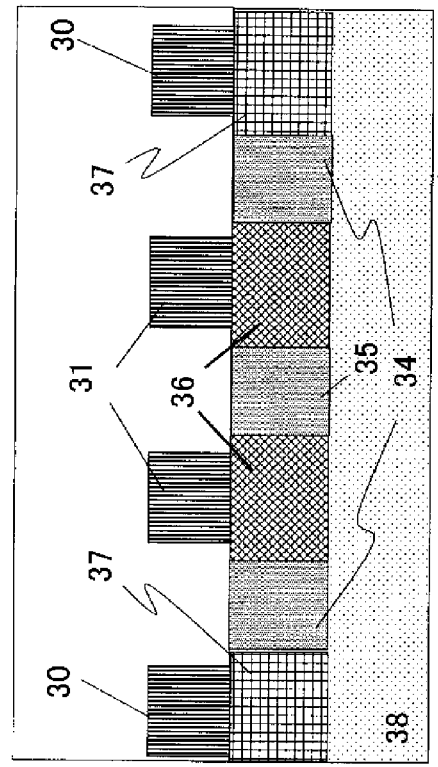
FIG. 4B is a cross-sectional view.

FIGS. 4A and 4B show the memory cell array according to the first embodiment of the present invention, wherein a plan view thereof is shown in FIG. 4A, a cross-sectional view thereof is shown in FIG. 4B, and another cross-sectional view thereof is shown in FIG. 4C.

In FIGS. 4A, 4B, and 4C, reference numerals 30 denote BG lines, reference numerals 31 denote FG lines, reference numerals 32 denote BL lines, reference numeral 33 denotes an SL line, reference numerals 34 denote 3-dimensional isolated regions of silicon called fin regions in each of which a memory cell is formed, reference numerals 34 denote dummy fin regions in which no memory cell is formed, reference numerals 36 denote front gate regions, reference numerals 37 denote back gate regions, reference numerals 38 denotes the insulating layer, called the BOX (Buried Oxide) layer, of the SOI substrate, reference numerals 39 denote contact holes for contact with corresponding back gate regions 37 (hereinafter such a contact hole will be referred to as a BG contact hole), reference numerals 40 denote contact holes for contact with corresponding front gate regions 36 (hereinafter such a contact hole will be referred to as an FG contact hole), reference numerals 41 denote contact holes for contact with corresponding source regions (hereinafter such a contact hole will be referred to as an SL contact hole), and reference numerals 42 denote contact holes for contact with corresponding drain regions (hereinafter such a contact hole will be referred to as a BL contact hole).

Referring to FIG. 4A showing the plan view of the memory cell array according to the first embodiment of the present invention, each fin region 34 is formed of silicon in the shape of an isolated rectangular parallelepiped on the BOX layer of the SOI substrate. In each fin region 34, two memory cells are formed. More specifically, each fin region 34 includes two front gate regions 36, two back gate regions 37, two drain regions, and one source region shared by the two memory cells whereby two memory cells having a similar structure to that shown in FIG. 2 are connected to each other such that the one source region is shared by the two memory cells. In this structure, the source region is formed in the center of the top surface of the fin region 34, and two drain regions are formed on respective two short sides of the rectangular-shaped top surface of the fin region 34. The front gate region 36 is formed on one long side of the rectangular-shaped top surface of the fin region 34 such that the drain region and the source region are separated from each other by the front gate region 36. The back gate region 37 is formed on the other long side of the rectangular-shaped top surface of the fin region 34 such that the drain region and the source region are separated from each other by the front gate region 36. The front gate region 36 is formed on a gate insulating film formed on one side surface of the fin region 34, and the back gate region 37 is formed on a gate insulating film formed on the opposite side surface of the fin region 34.

Thus, the above-described configuration shown in FIGS. 4A to 4C in which one source region is shared by two memory cells allows a reduction in total area compared with a total area needed to simply dispose two fin regions similar to that shown in FIG. 2 side by side.

Each dummy fin region 35 is formed of silicon in the shape of the isolated rectangular parallelepiped on the BOX layer of the SOI substrate. Only the source region is formed in the center of the top surface of the dummy fin region 35.

The memory cell array shown in FIG. 4R includes linear arrays of fin regions including fin regions 34 disposed in the column direction, and linear arrays of dummy fin regions including dummy fin regions 35 disposed in the column direction. In the memory cell array shown in FIG. 4A, two linear arrays of fin regions and one linear array of dummy regions are alternately disposed in the row direction. Between adjacent fin regions 34 disposed in the column direction, there is a device isolation region formed of an insulating material such as a silicon oxide film. Each linear array of dummy fin regions serves as a device isolation region by which two adjacent linear arrays of fin regions are isolated from each other.

Thus, in this configuration, each front gate region 36 is located between a linear array of dummy fin regions and a linear array of fin regions, and each back gate region 37 is located between two adjacent linear arrays of fin regions. Thus, in this configuration, each back gate region 37 is shared by two adjacent memory cells, while each memory cell has its own separate front gate region 36.

BG lines 30 extend in the column direction. Back gate regions 37 of respective memory cells located in each column of the memory cell array are connected in common to one of the BG lines 30 via BG contact holes 39.

FG lines 31 extend in the column direction. Front gate regions 36 of respective memory cells located in each column of the memory cell array are connected in common to one of the FG line via FG contact holes 40.

BL lines 32 extend in the row direction. Drain regions of respective memory cells located in each row of the memory cell array are connected together to one BL line 32 via BL contact holes 42.

SL lines 33 extend in the row direction. Source regions of respective memory cells and source regions of dummy fin regions located in each row of the memory cell array are connected in common to one of the SL lines 33 via SL contact holes 41.

Referring to FIG. 4B showing a cross section, taken along a line A-A', of the memory cell array according to the first embodiment, each back gate region 37 is in contact with one BG line 30 via a BG contact hole 39. Each front gate region 36 is in contact with one FG line 31 via an FG contact hole 40.

The FG lines 36 and the BG lines 30 are formed of the same material in the same first interconnection layer. Note that the FG lines 31 and the BG lines 30 extend in a direction perpendicular to the cross section AA'. A dummy fin region 35, a front gate region 36, a fin region 34, a hack gate region 37, a fin region 34, and a front gate region 36 are located periodically in this order in a direction parallel to the cross section AA'.

Referring to FIG. 4C showing a cross section, taken along a line B-B', of the memory cell array according to the first embodiment, the drain region of each memory cell is in contact with one BL line 32 via a BL contact hole 42. The BL lines 32 extend in a direction parallel to the cross section BB'. Although not shown in FIG. 4C, the source regions of each memory cell is in contact with one SL line 33 via an SL contact hole 41. Note that the SL lines 33 and the BL lines 32 are formed of the same material in the same second interconnection layer. The SL lines 33 extend in the direction parallel to the cross section BB'. A dummy fin region 35, an insulating region 43, a fin region 34, an insulating region 43, a fin region 34, and an insulating region 43 are located periodically in this order in the direction parallel to the cross section BB'.

Thus, the pattern repetition pitches of the memory cell array according to the first embodiment shown in FIG. 4A are as follows.

In the row direction, a dummy fin region, a front gate region, a fin region, a back gate region, a fin region, and a front gate region are disposed periodically in this order. In the column direction, a device insulation region, a drain region (connected to a BL line), a front gate region and a back gate region, a source region, a front gate region and a back gate region, and a drain region are disposed periodically in this order.

The device insulation regions, the front gate regions and the back gate regions, the source regions, the drain regions, the dummy fin regions 35, and the fin regions can be formed such that each of these regions have a width equal to a minimum line width (referred to as a fine pitch F) defined in a photolithographic process used. Thus, in the row direction, the same pattern appears periodically at intervals equal to 6 F, that is, the repetition pitch in the row direction is equal to 6 F. In the column direction, the same pattern also appears periodically at intervals equal to 6 F, that is, the repetition pitch in the column direction is also equal to 6 F. Thus, memory cells for four bits are formed in an area with a size of 6 F×6 F=36 F$^2$. Therefore, the area needed to form a memory cell of one bit is 9 F$^2$.

In the memory cell array according to the first embodiment, one back gate electrode region is shared by two memory cells adjacent in the row direction, and no device insulation region is formed on the side of the back gate electrode region. This configuration allows a reduction in the length of the memory cell array in the row direction, and thus a reduction in the total area of the memory cell array according to the first embodiment.

Referring to FIGS. 5 to 8, a process of producing the memory cell array according to the first embodiment is described below.

FIG. 5 includes FIGS. 5A, 5B, 5C, 5D, 5E, and 5F. In FIG. 5, reference numeral 50 denotes a resist pattern, reference numeral 51 denotes a BOX layer of an SOI substrate, reference numeral 52 denotes a silicon layer of the SOI substrate, reference numeral 53 denotes an insulating layer, reference numeral 54 denotes a fin region, reference numeral 55 denotes a dummy fin region, reference numeral 56 denotes a gate insulating film, and reference numeral 57 denotes a polysilicon (P—Si) layer.

Referring to a cross-sectional view shown in FIG. 5A and a perspective view shown in FIG. 5B, an insulating layer 53 is first formed on a silicon layer 52 of the SOI substrate by a CVD method. Resist patterns 50 are formed on the insulating layer 53 by a photolithography process. The SOI substrate includes a silicon substrate, the BOX layer 51 formed on the silicon substrate, and the silicon layer 52 formed on the BOX layer 51. Preferably, the BOX layer 51 has a thickness of about 100 nm, and the silicon layer has a thickness of about 50 nm. The insulating layer 51 preferably has a thickness of about 100 nm. Each resist pattern 50 has a rectangular shape preferably being about 210 nm long in a longitudinal direction and about 30 nm long in a lateral direction.

After completion of the processing step described above with reference to FIGS. 5A and 5B, the fin regions 54 and the dummy fin regions 55 are formed by performing a processing step described below with reference to a cross-sectional view shown in FIG. 5C and a perspective view shown in FIG. 5D. First, the insulating layer 53 is etched by an anisotropic etching method using the resist pattern 50 as a mask. The silicon layer 52 is then etched by an anisotropic etching method. As a result of the etching of the silicon layer 52, silicon 3-dimensional isolated regions are formed as the fin region 54 and the dummy fin region 55 on the BOX layer 51.

Referring to a cross-sectional view shown in FIG. 5E and a perspective view shown in FIG. 5F, a processing step of depositing the poly-silicon (P—Si) layer 57, performed after the processing step shown in FIGS. 5C and 5D, is described below. First, the gate insulating film 56 is formed by a thermal oxidation method. Thereafter, the poly-silicon (P—Si) layer 57 is deposited by a CVD method. It is desirable that the gate insulating film 56 be formed to a thickness of about 5 nm, and the poly-silicon (P—Si) layer 57 be deposited to a thickness of about 100 nm.

FIG. 6 includes FIGS. 6A, 6B, 6C, 6D, 6E, and 6F. In FIG. 6, reference numeral 51 denotes the BOX layer of the SOI substrate, reference numeral 53 denotes the insulating layer, reference numeral 54 denotes the fin region, reference numerals 55 denotes dummy fin regions, reference numeral 56 denotes the gate insulating film, reference numeral 57 denotes the poly-silicon (P—Si) layer. Reference numerals 58 denote front gate regions, reference numeral 59 denote a back gate region, and reference numeral 60 denotes an insulating layer.

Figure 6A:
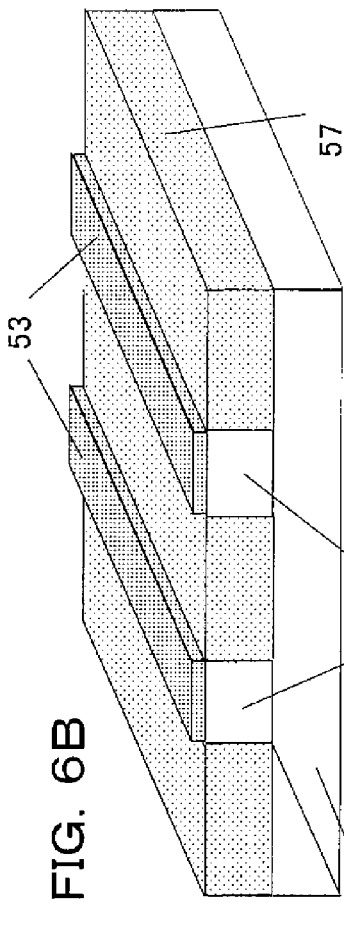
FIGS. 6A to 6F show processing steps of producing a memory cell array according to an embodiment of the present invention.
Figure 6B:
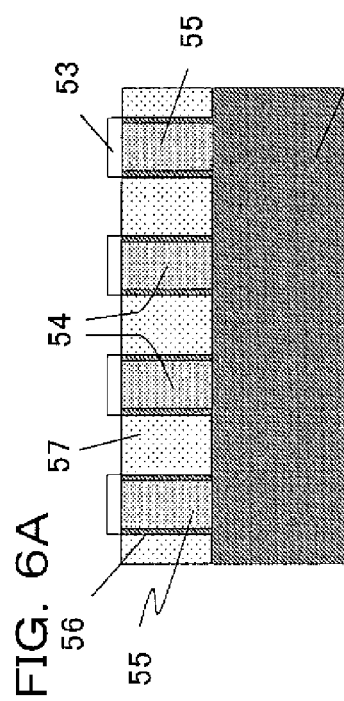

After completion of the processing step described above with reference to FIGS. 5E and 5F, the poly-silicon (P—Si) layer 57 is etched by performing a processing step described below with reference to a cross-sectional view shown in FIG. 6A and a perspective view shown in FIG. 6B. First, the poly-silicon (P—Si) layer 57 is planarized by a CMP (Chemical Mechanical Polishing) method. Subsequently, the poly-silicon (P—Si) layer 57 is further etched by an isotropic etching method so that the poly-silicon (P—Si) layer 57 has a height substantially equal to the height of the fin region 54 or the dummy fin region 55.

After completion of the processing step described above with reference to FIGS. 6A and 6B, the front gate region 58 and the back gate region 59 are formed by performing a processing step described below with reference to a cross-sectional view shown in FIG. 6C and a perspective view shown in FIG. 6D. First, a rectangular resist pattern is formed on the planarized poly-silicon (P—Si) layer using a photolithography technique. The poly-silicon (P—Si) layer 57 is then etched by the anisotropic etching technique using the resist pattern as a mask so as to form the front gate region 58 and the back gate region 59.

Referring to a cross-sectional view shown in FIG. 6E and a perspective view shown in FIG. 6F, a processing step of depositing the insulating film 60 using a CVD method is described below.

FIG. 7 includes FIGS. 7A, 7B, 7C, 7D, 7E, and 7F. In FIG. 7, reference numeral 51 denotes the BOX layer of an SOI substrate, reference numeral 53 denotes the insulating layer, reference numeral 54 denotes the fin region, reference numeral 55 denotes the dummy fin region, reference numeral 56 denotes the gate insulating film, reference numerals 58 denote front gate regions, reference numerals 59 denote back gate regions, reference numeral 60 denotes the insulating layer, reference numeral 61 denote a BG line, reference numerals 62 denote FG lines, and reference numeral 63 denotes an interlayer insulating layer.

After completion of the processing step described above with reference to FIGS. 6E and 6F, the insulating layer 60 is etched by performing a processing step described below with reference to a cross-sectional view shown in FIG. 7A and a perspective view shown in FIG. 7B. First, the insulating layer 60 is planarized by the CMP method. Subsequently, the insulating layer 60 is further etched by an isotropic etching method so that the insulating layer 60 has a height substantially equal to the height of the front gate region 58 and the back gate region 59.

After completion of the processing step described above with reference to FIGS. 7A and 7B, the poly-silicon (P—Si) layer is etched by performing a processing step described below with reference to a cross-sectional view shown in FIG. 7C and a perspective view shown in FIG. 7D. First, the poly-silicon (P—Si) layer is deposited on the front gate region 58, the back gate region 59, and the insulating layer 60 by using a CVD method. It is desirable that the poly-silicon (P—Si) layer be formed to a thickness of about 50 nm. Thereafter, a rectangular resist pattern is formed on the poly-silicon (P—Si) layer by using a photolithography method. The poly-silicon (P—Si) layer is then etched by an anisotropic etching technique using the resist pattern as a mask so as to form the BG line 61 and the FG lines 62. As a result, the front gate region 58 comes into contact with the FG line 62 via the FG contact hole 40 shown in FIG. 4A, and the back gate region 59 comes into contact with the BG line via the BG contact hole 39 shown in FIG. 4A.

After completion of the processing step described above with reference to FIGS. 7C and 7D, the interlayer insulating film 63 is deposited using the CVD method, and the formed interlayer insulating film 63 is planarized by using the CMP method as shown in a cross-sectional view of FIG. 7E and a perspective view of FIG. 7F.

FIG. 8 includes FIGS. 8A, 8B, 8C, and 8D. In FIG. 8, reference numeral 51 denotes the BOX layer of the SOI substrate, reference numeral 53 denotes the insulating layer, reference numeral 54 denotes the fin region, reference numerals 55 denotes dummy fin regions, reference numeral 56 denotes the gate insulating film, reference numerals 58 denote front gate regions, reference numeral 59 denotes the back gate region, reference numeral 60 denotes the insulating layer, reference numeral 61 denotes the BG line, reference numerals 62 denote FG lines, reference numeral 63 denotes the interlayer insulating layer, reference numerals 64 denote BL contact holes, reference numerals 65 denote SL contact holes, reference numeral 66 denotes the BL line, and reference numeral 67 denotes the SL line.

After completion of the processing step described above with reference to FIGS. 7E and 7F, tungsten (W) is embedded in contact holes by performing a processing step described below with reference to a cross-sectional view shown in FIG.

8A and a perspective view shown in FIG. 8B. First, contact holes are formed in the interlayer insulating layer 63, at locations corresponding to the source region and the drain regions of the fin region 54. Thereafter, a metal layer such as tungsten (W) layer to be embedded in the contact holes is deposited by using the CVD method or the sputtering method. Preferably, the tungsten (W) layer is formed to a thickness of about 20 nm. The tungsten (W) layer on the interlayer insulating layer 63 is then polished by using the CMP method so that tungsten (W) other than parts in the contact holes is removed. As a result, tungsten (W) is embedded in the contact holes. The source region and the SL line 67 are connected to each other via the tungsten embedded in the BL contact hole 64, and the drain region and the BL line 66 are connected to each other via the tungsten (W) embedded in the SL contact hole 65. The metal layer does not necessarily need to be formed of tungsten but may be formed of other metals such as aluminum (Al) or copper (Cu).

After completion of the processing step described above with reference to FIGS. 8A and 8B, tungsten (W) interconnection lines are formed by performing a processing step described below with reference to a cross-sectional view shown in FIG. 8C and a perspective view shown in FIG. 8D. First, a metal layer, for example, a tungsten (W) layer is formed using a CVD method or a sputtering method, and a rectangular resist pattern is formed on the tungsten (W) layer. The tungsten (W) layer is then etched by the anisotropic etching method using the resist pattern as a mask so as to form the tungsten (W) interconnection lines. As a result, the BL line 66 is in contact with the source region via the BL contact hole 64, and the SL line 67 is in contact with the drain region via the SL contact hole 65 are formed.

Each memory cell in the memory cell array according to the first embodiment is formed in a corresponding fin region as shown in the plan view of FIG. 4A. The memory cell array according to the first embodiment includes the BL lines, the SL lines, the FG lines, and the BG lines. Each memory cell includes a source region, a drain region, a front gate region, and a back gate region. When memory cells are combined into the memory cell array, memory cells are configured such that the back gate region of each memory cell is shared by a memory cell adjacent in the row direction, and such that the source region is shared by a memory cell adjacent in the column direction. The BL lines and the SL lines extend in the row direction and each BL line is in contact with source regions of respective memory cells in a particular corresponding row, while each SL line is in contact with drain regions of respective memory cells in a particular corresponding row. The FG lines and the BG lines extend in the column direction and each FG line is in contact with front gate regions of respective memory cells in a particular corresponding column, while each BG line is in contact with back gate regions of respective memory cells in a particular corresponding column.

In the configuration according to the first embodiment, as described above, each source region and each back gate region are shared by adjacent memory cells, and thus a reduction in the total area of the memory cell array composed of memory cells is achieved.

If one of the BL lines extending in the row direction and one of FG lines extending in the column direction are activated, then only one memory cell located at the intersection of the activated BL line and FG line is connected to both the activated BL line and FG line, and this only one memory cell is activated.

In the reading operation, the BG line is at a negative voltage, and thus information stored in the activated memory cell is read.

On the other hand, in the writing operation, the voltage applied to the BG line is set to the negative voltage or 0 V depending on the state into which the memory cell is to be brought. Because the back gate region connected to the activated BG line is shared by two adjacent memory cells, the voltage is applied to the back gate region of memory cells located in two adjacent columns. However, to write data in a memory cell, it is required that a voltage must be applied between the source region and the drain region of this memory cell and a voltage must be applied to the gate region so that a current flows between the source region and the drain region. Thus, of memory cells whose back gate region is applied with the voltage, writing is performed only for the memory cell whose drain region and front gate region are applied with the voltages via the activated BL line and FG line. Therefore, although each back gate region is shared by two adjacent memory cells, multiple selection of memory cells does not occur in the reading and writing operations.

Thus, the memory cell array according to the first embodiment can be configured so as to have a high device density without causing a problem with multiple selection, and thus the memory cell array according to the first embodiment is advantageous for use as a memory embedded in an LSI.

Second Embodiment

Referring to FIGS. 9 to 12, a memory cell array according to a second embodiment of the present invention is described below.

The memory cell array according to the second embodiment is composed of memory cells which are similar to those according to the first embodiment except that each back gate region, each source region, each front gate region, and each drain region are shaped by adjacent memory cells.

FIGS. 9A, 9B, 9C, 9D, and 9E show the memory cell array according to the second embodiment of the present invention.

In FIGS. 9A to 9E, reference numerals 70 denote SL lines, reference numeral 71 denotes a BG line, reference numerals 72 denote FG lines, reference numerals 73 denote BL lines, reference numerals 74 denote 3-dimensional isolated regions of silicon called fin regions in each of which a memory cell is formed, reference numeral 75 denotes a back gate region, reference numerals 76 denote front gate regions, reference numeral 77 denotes a contact hole for contact with a corresponding source region of a memory cell (hereinafter such a contact hole will be referred to as an SL contact hole), reference numeral 78 denotes a contact hole for contact with a corresponding back gate region of a memory cell (hereinafter such a contact hole will be referred to as a BG contact hole), reference numeral 79 denotes a contact hole for contact with a corresponding front gate region of a memory cell (hereinafter such a contact hole will be referred to as an FG contact hole), and reference numeral 80 denotes a contact hole for contact with a corresponding drain region of a memory cell (hereinafter such a contact hole will be referred to as a BL contact hole).

Figure 9A:
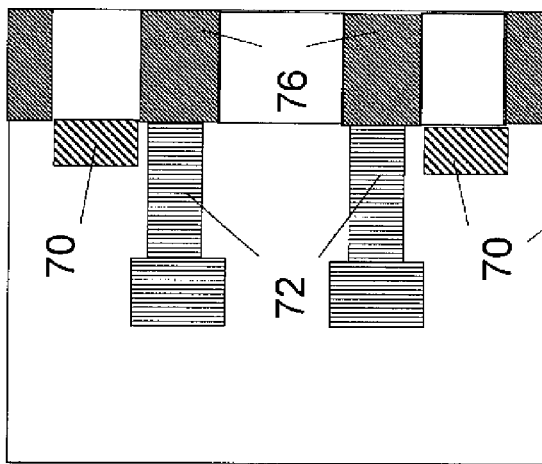
FIGS. 9A to 9E show a memory cell array according to an embodiment of the present invention.

FIG. 9A shows a plan view of the memory cell array according to the second embodiment.

Each fin region 74 is formed of silicon in the shape of an isolated rectangular parallelepiped whose long sides extend in a column direction, on a BOX layer of an SOI substrate. In each fin region 74, a plurality of memory cells are continuously formed in the column direction so as to form a linear array of memory cells. More specifically, in each fin region 74, memory cells each of which is similar to the memory cell shown in FIG. 2 are formed such that source regions of two adjacent memory cells are connected together or drain regions of two adjacent memory cells are connected together.

A plurality of linear arrays of memory cells including memory cells formed in respective fin regions 74 are sequentially disposed in the row direction thereby forming the memory cell array as shown in FIG. 9.

Thus, the source regions and drain regions of memory cells are located on the top surface of the fin regions 74 and source regions and drain regions are alternately located in the column direction. Each source region is shared by two memory cells adjacent in the column direction, and each drain region is shared by two memory cells adjacent in the column direction.

The front gate region 76 of each memory cell is formed on one of long side surfaces of a rectangular-shaped fin region 74 such that the drain region and the source region of the memory cell is separated by the front gate region 76. The back gate region 75 of each memory cell is formed on the other one of long side surfaces of the rectangular-shaped fin region 74 such that the drain region and the source region of the memory cell is separated by the back gate region 76. The front gate region 76 and the back gate region 75 of each memory cell are in contact with respect side surfaces of the fin region 74 via a gate insulating film. Each front gate region 76 and each back gate region 75 are shared by memory cells adjacent in the row direction.

Each BG line 71 extends in the column direction and is in contact, via BG contact holes 78, with back gate regions of respective memory cells located in corresponding one of columns.

Each FG line 72 extends in the row direction and is in contact, via FG contact holes 79, with front gate regions of respective memory cells located in corresponding one of rows.

Each BL line 73 extends in the column direction and is in contact, via BL contact holes 80, with drain regions of respective memory cells located in corresponding one of columns.

Each SL line 70 extends in the row direction and is in contact, via SL contact holes 77, with source regions of respective memory cells located in corresponding one of rows.

The sharing of source regions and drain regions by memory cells and the sharing of front gate regions and the back gate regions by memory cells allow a reduction in the area in which memory cells are formed in fin regions in the form of an array compared with the area in which the fin regions shown in FIG. 2 are simply disposed in the form of an array In the configuration of the memory cell array shown in FIG. 9, compared with the configuration of the memory cell array shown in FIG. 4, greater parts are shared by memory cells, and thus a further reduction in the total area of the memory cell array is achieved.

Figure 9D:
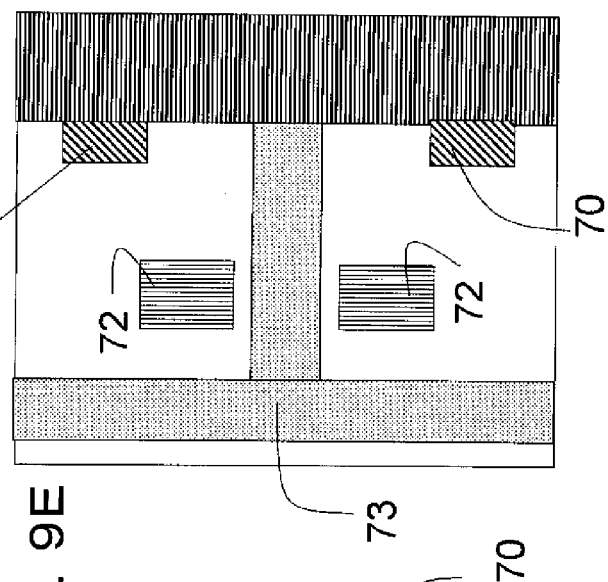
Figure 9E:
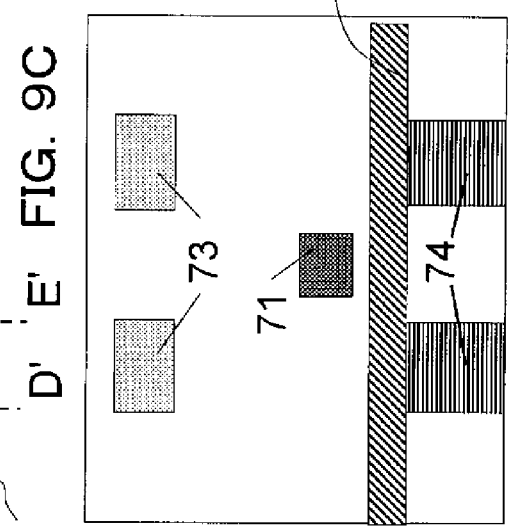
Figure 9C:
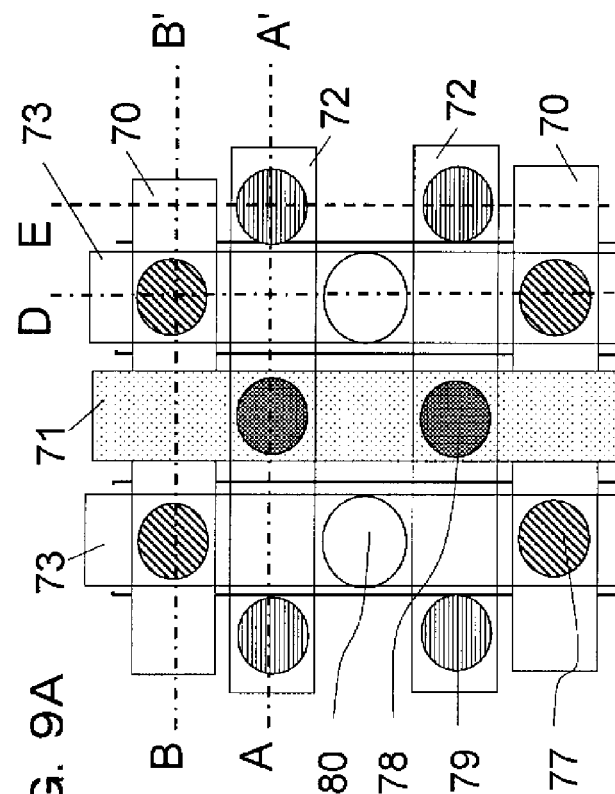
Figure 9B:
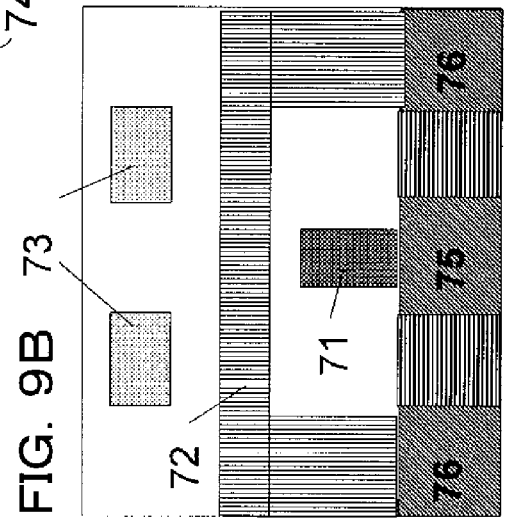

FIG. 9B shows a cross-sectional view taken along a line A-A' shown in FIG. 9A. As can be seen from FIG. 9B, each BG line 71 is formed in a second interconnection layer and is in contact with back gate regions 75 via BG contact holes 78. Each BG line 71 extends in a direction perpendicular to the cross section AA'. Each FG line 72 is formed in a third interconnection layer and is in contact with front gate regions 76 via FG contact holes 79. Each PG line 72 extends in a direction parallel to the cross section AA'. Each BL line 73 is formed in a fourth interconnection layer such that each BL line 73 extends in a direction perpendicular to the cross section AA'. A front gate region 76, a fin region 74, a back gate region 75, and a fin region 74 are located periodically in this order in a direction parallel to the cross section AA'.

FIG. 9C shows a cross-sectional view taken along a line B-B' shown in FIG. 9A. As can be seen from FIG. 9C, each SL line 70 is formed in the first interconnection layer and is in contact, via SL contact holes 77, with source regions formed on the top surfaces of the fin regions 74. Each SL line 70 extends in the direction parallel to the cross section BB'. Each BG line 71 is formed in the second interconnection layer above the SL lines such that each BG line 71 extends in the direction perpendicular to the cross section BB'. Each BL line 73 is formed in the fourth interconnection layer above the BG lines such that each BL line 73 extends in the direction perpendicular to the cross section BB'. The fin regions 74 extend in the direction perpendicular to the cross section BB'. A fin region 74 and an insulating region are disposed periodically in this order in the direction parallel to the cross section BB'.

FIG. 9D shows a cross-sectional view taken along a line D-D' shown in FIG. 9A. As can be seen from FIG. 9D, each BL line 73 extends in the direction parallel to the cross section DD' and is in contact, via contact holes, with drain regions formed on the top surface of the fin region. Each FG line 72 extends in the direction perpendicular to the cross section DD', and each SL line 70 also extends in the direction perpendicular to the cross section DD'. Each fin region 74 extends in the direction parallel to the cross section DD'.

FIG. 9E shows a cross-sectional view taken along a line E-E' shown in FIG. 9A. As can be seen from FIG. 9E, each front gate region 76 is in contact, via an FG contact hole 79, with corresponding one of FG lines 72 extending in the direction perpendicular to the cross section EE'. Each SL line 70 extends in the direction perpendicular to the cross section EE'. A front gate region 76 and an insulating region are disposed periodically in this order in the direction parallel to the cross section EE'.

Thus, the pattern repetition pitches of the memory cell array according to the second embodiment shown in FIG. 9A are as follows.

In the row direction, a fin region, a front gate region, a fin region, and a back gate region are disposed periodically in this order. On the other hand, in the column direction, a drain region (connected to a BL line), a front gate region and a back gate region, a source region, and a front gate region and a back gate region are disposed periodically in this order.

In this periodic pattern, the device isolation regions, the front gate regions and the back gate regions, the source regions, the drain regions, and the fin regions can be formed such that each of these regions have a width equal to a minimum line width (referred to as a fine pitch F) defined in a photolithographic process used. Thus, in the row direction, respective regions appear periodically at intervals equal to 4 F, that is, a repetition pitch in the row direction is equal to 4 F. In the column direction, the same pattern also appears periodically at intervals equal to 4 F, that is, the repetition pitch in the column direction is also equal to 4 F. Thus, memory cells for four bits are formed in an area with a size of 4 F×4 F=16 $F^2$. Therefore, the area needed to form a memory cell of one bit is 4 $F^2$.

Referring to FIGS. 10 to 12, a process of producing the memory cell array according to the second embodiment is described below. The process of producing the memory cell array according to the second embodiment is similar to that according to the first embodiment in steps shown in FIGS. 5A, 5B, 5C, 5E, 5F, 6A, 6B, 6C, and 6D.

In FIG. 10, reference numeral 85 denotes a BOX layer of an SOI substrate, reference numeral 90 denotes an insulating layer, reference numerals 86 denote fin regions, reference numeral 89 denotes a gate insulating film, reference numerals 87 denote front gate regions, reference numeral 88 denotes a back gate region, reference numeral 91 denotes an insulating layer for device isolation, reference numeral 92 denotes an SL line, reference numeral 93 denotes a contact hole via which to connect the SL line 92 to the source region of a memory cell.

Figure 6C:
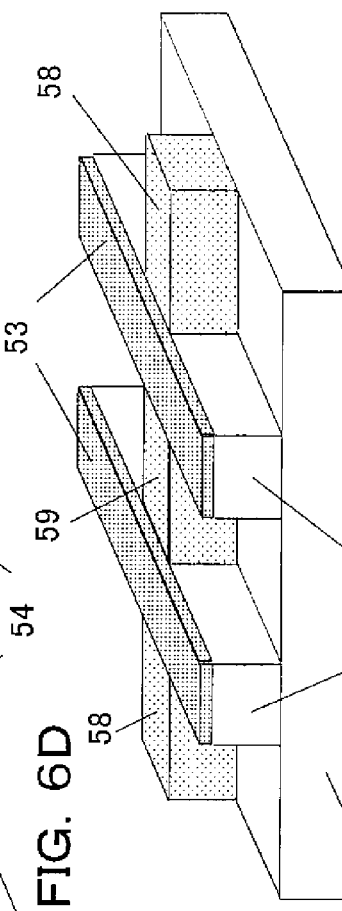
Figure 6D:
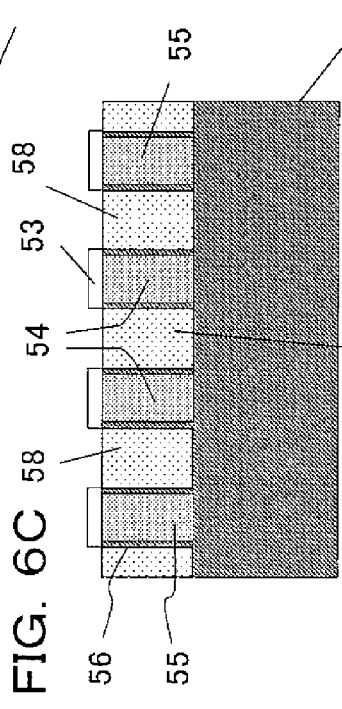
Figure 6E:
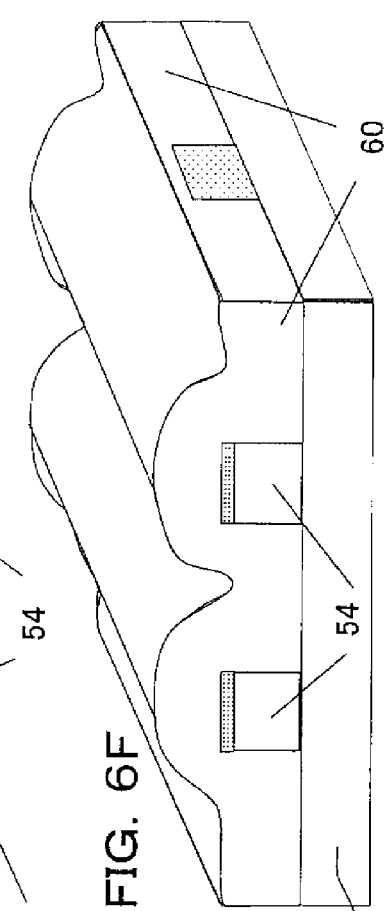
Figure 6F:
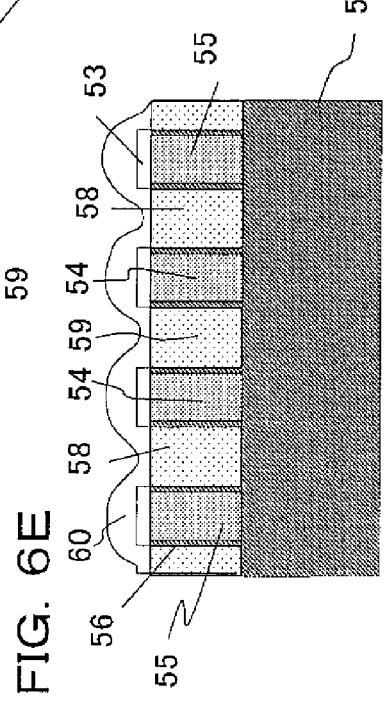
Figure 10A:
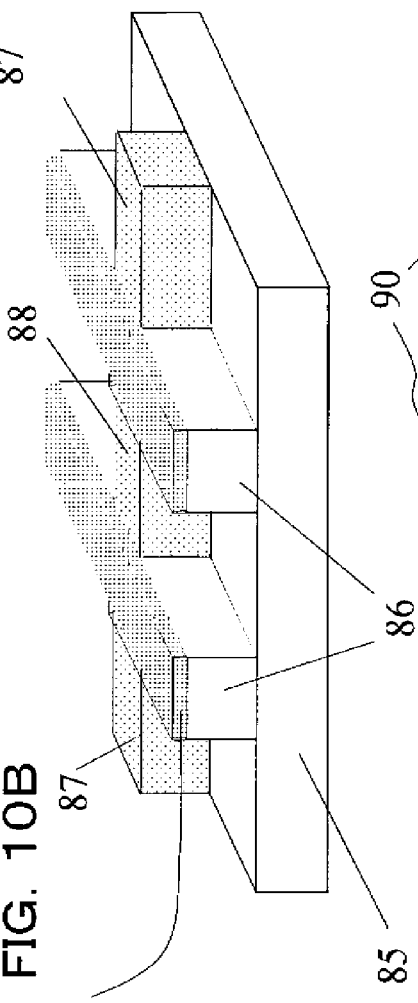
FIGS. 10A to 10F show processing steps of producing a memory cell array according to an embodiment of the present invention.
Figure 10B:
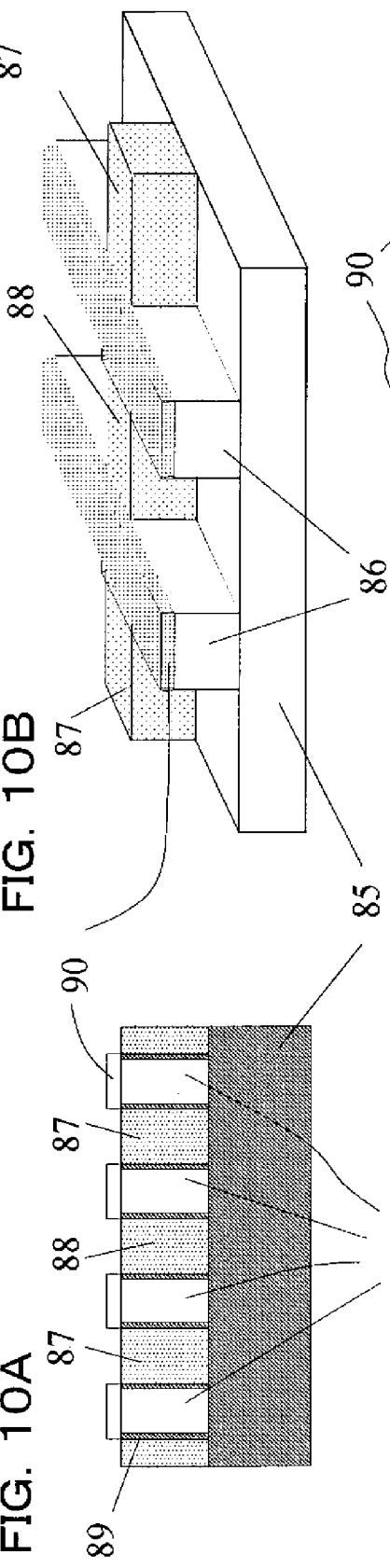

FIG. 10A shows a cross section and FIG. 10B shows a perspective view of the memory cell array in a state in which a processing step similar to that shown in FIGS. 6C and 6D are complete.

Figure 10C:
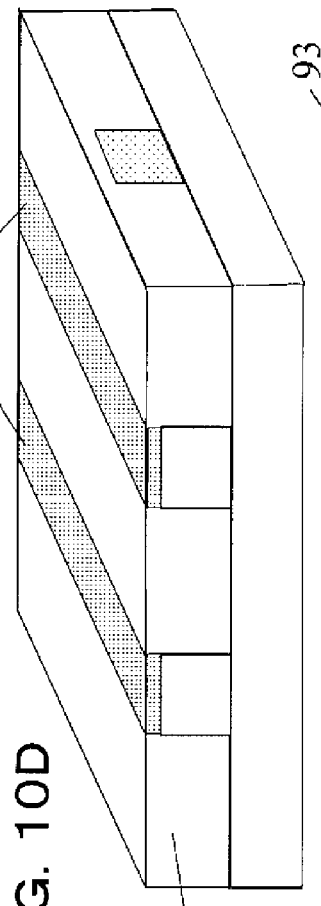
Figure 10D:
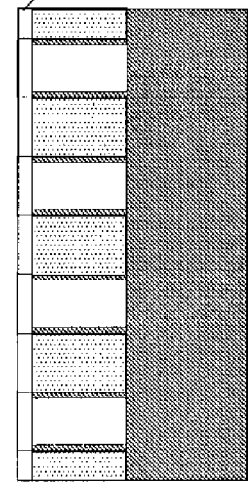

After completion of the processing step shown in FIGS. 10A and 10B, a processing step of planarizing the insulating layer 91 for device isolation is performed as shown in a cross-sectional view of FIG. 10C and a perspective view of FIG. 10D. First, using a CVD method, the insulating layer 91 for device isolation is deposited. Next, using a CMP method, the insulating layer 91 for device isolation is planarized such that the insulating layer 91 becomes substantially flush with the upper surface of the insulating layer 90.

Figure 10E:
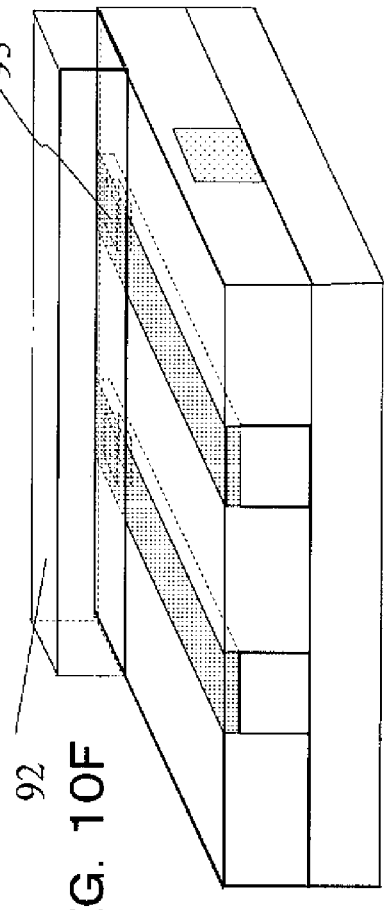
Figure 10F:
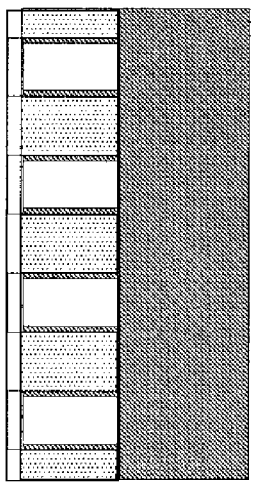

After completion of the processing step shown in FIGS. 10C and 10D, SL lines are formed by performing a processing step described below with reference to a cross-sectional view shown in FIG. 10E and a perspective view shown in FIG. 10F. First, using a photolithography technique, a resist pattern having windows at locations corresponding to source regions of the respective memory cells is formed. Next, the insulating layer 90 is etched by an anisotropic etching method using the resist pattern as a mask so as to form contact holes 93 reaching the source regions of the memory cells. Thereafter, the resist pattern is removed. A metal layer, for example, a tungsten (W) layer with a thickness of about 20 nm is formed using a CVD method or a sputtering method. A resist pattern for forming the SL lines 92 is then formed using the photolithographic method. The tungsten (W) layer is then etched by the anisotropic etching technique using the resist pattern as a mask so as to form the SL lines 92. After completion of the etching, the resist pattern is removed.

Although in the present example the tungsten (W) layer is used as the metal layer, other metals such as aluminum (Al) or copper (Cu) may be used to form the metal layer.

In FIG. 11, reference numeral 85 denotes the BOX layer on the SOI substrate, reference numerals 86 denote the fin regions, reference numerals 87 denote front gate regions, reference numeral 88 denotes the back gate region, reference numeral 89 denotes the gate insulating film, reference numeral 90 denotes the insulating layer, reference numeral 91 denotes the insulating layer for device isolation, reference numeral 92 denotes the SL line, reference numeral 94 denotes an interlayer insulating layer, reference numeral 95 denotes a contact hole, reference numeral 96 denotes a BG line, and reference numeral 97 denotes an interlayer insulating layer.

After completion of the processing step described above with reference to FIGS. 10E and 10F, BG lines 96 are formed as described below with reference to a cross-sectional view shown in FIG. 11A and a perspective view shown in FIG. 11B. First, in order to form the interlayer insulating layer 94, a silicon dioxide ($SiO_2$) film with a thickness of about 60 nm to 80 nm is deposited using a CVD method. Next, the interlayer insulating layer 94 is planarized using the CMP method so that the interlayer insulating layer 94 has a thickness of about 20 nm on the tungsten (W) layer. A resist pattern having windows at locations corresponding to the drain regions, the back gate regions 88 and the front gate regions 87 of respective memory cells is formed. The interlayer insulating layer 94 is then etched by the anisotropic etching method using the resist pattern as a mask so as to form contact holes 95 reaching the drain regions, the back gate regions 88 or the front gate regions 87 of the memory cells. To embed a metal material in the contact holes 95, a metal layer such as a tungsten (W) layer with a thickness of about 20 nm is formed on the interlayer insulating layer 94 by using the CVD method or the sputtering method. A resist pattern for forming the BG lines 96 is then formed on the tungsten (W) layer by using the photoresist process. The tungsten (W) layer is then etched by the anisotropic etching method using the resist pattern as a mask so as to form the BG lines 96. As a result, each back gate region 88 comes into contact with corresponding one of BG lines 96 via the metal material embedded in a corresponding contact hole 95 on the back gate region 88. The contact holes 95 on the respective drain electrodes and the contact holes on the front gate regions 87 are filled with the metal material, that is, tungsten (W) in the present example. However, no interconnection lines are formed on the contact holes 95 on the drain electrode and the front gate regions 87. Note that instead of tungsten (W), other metals such as aluminum (Al) may be used.

After completion of the processing step described above with reference to FIGS. 11A and 11B, the interlayer insulating layer 97 is formed so as to cover the BG lines 96 by performing the following processing step described below with reference to a cross-sectional view shown in FIG. 11C and a perspective view shown in FIG. 11D. First, using the CVD method, an insulating layer such as a silicon dioxide ($SiO_2$) film with a thickness of about 60 nm to 80 nm is deposited so as to cover the BG lines 96. Next, the silicon dioxide ($SiO_2$) film is planarized using the CMP method so that the silicon dioxide ($SiO_2$) film has a thickness of about 20 nm on the BG lines 96 thereby forming the interlayer insulating layer 97.

In FIG. 12, reference numeral 85 denotes the BOX layer on the SOI substrate, reference numerals 86 denote the fin regions, reference numerals 87 denote the front gate regions, reference numeral 88 denotes the back gate region, reference numeral 89 denotes the gate insulating film, reference numeral 90 denotes the insulating layer, reference numeral 91 denotes the insulating layer for device isolation, reference numeral 92 denotes the SL line, reference numeral 94 denotes the interlayer insulating layer, reference numeral 95 denotes the contact hole, reference numeral 96 denotes the BG line, reference numeral 97 denotes the interlayer insulating layer, reference numeral 98 denotes the contact hole, reference numerals 99 denote the FG line, reference numeral 100 denotes the contact hole, reference numeral 101 denotes the interlayer insulating layer, and reference numeral 102 denotes the BL line.

After completion of the processing step described above with reference to FIGS. 11C and 11D, FG lines 99 are formed by performing a processing step described below with reference to a cross-sectional view shown in FIG. 12A and a perspective view shown in FIG. 12B. First, in order to form the interlayer insulating layer 97, a silicon dioxide ($SiO_2$) film with a thickness of about 60 nm to 80 nm is deposited using the CVD method. Next, the interlayer insulating layer 94 is planarized using the CMP method so that the interlayer insulating layer 94 has a thickness of about 20 nm on the tungsten (W) layer. Thereafter, using the photolithography technique, a resist pattern having windows at locations corresponding to the contact holes 95 in on the front gate regions 88 is formed. The interlayer insulating layer 97 is then etched by the anisotropic etching method using the resist pattern as a mask so as to form contact holes 98 on the respective contact holes 95 on the front gate regions 88. Thereafter, to embed a metal material in the contact holes 98, a metal layer such as a tungsten (W) layer with a thickness of about 20 nm is formed on the interlayer insulating layer 97 by using the CVD method or the sputtering method. A resist pattern for forming the FG lines 99 is then formed on the tungsten (W) layer by using the photoresist process. The tungsten (W) layer is then etched by the anisotropic etching method using the resist pattern as a mask so as to form the FG lines 99. As a result, each back gate region 88 comes into contact with corresponding one of FG lines 99 via the metal material (tungsten (W) in this specific example) embedded in a corresponding contact hole 98 and a corresponding contact hole 95 on the back gate region 88. Note that instead of tungsten (W), other metals such as aluminum (Al) may be used.

After completion of the processing step described above with reference to FIGS. 12A and 12B, BL lines 102 are formed by performing a processing step described below with reference to a cross-sectional view shown in FIG. 12C and a perspective view shown in FIG. 12D. First, in order to form the interlayer insulating layer 101, a silicon dioxide ($SiO_2$) film with a thickness of about 60 nm to 80 nm is deposited using the CVD method. Next, the interlayer insulating layer 101 is planarized using the CMP method so that the interlayer insulating layer 101 has a thickness of about 20 nm on the tungsten (W) layer. A resist pattern having windows at locations corresponding to the contact holes 95 on the drain regions of the respective memory cells is formed. The interlayer insulating layer 101 is then etched by the anisotropic etching method using the resist pattern as a mask so as to form contact holes 100 on the respective contact holes 95 on the drain regions of the respective memory cells. Thereafter, to embed a metal material in the contact holes 100, a metal layer such as a tungsten (W) layer with a thickness of about 20 nm is formed on the interlayer insulating layer 101 by using the CVD method or the sputtering method. A resist pattern for forming the BL lines 102 is then formed on the tungsten (W) layer by using the photoresist process. The tungsten (W) layer is then etched by the anisotropic etching method using the resist pattern as a mask so as to form the BL lines 102. As a result, the drain region of each memory cell comes into contact with corresponding one of BL lines 102 via the metal material (tungsten (W) in this specific example) embedded in a corresponding contact hole 100 and a corresponding contact hole 95 on the drain region of the memory cell. Note that instead of tungsten (W), other metals such as aluminum (Al) may be used.

Each memory cell in the memory cell array according to the second embodiment is formed in a corresponding fin region as shown in the plan view of FIG. 9A. The memory cell array according to the second embodiment includes the BL lines, the SL lines, the FG lines, and the BG lines. Each memory cell includes a source region, a drain region, a front gate region, and a back gate region. When memory cells are combined into the memory cell array, memory cells are configured such that the back gate region of each memory cell is shared by a memory cell adjacent in the row direction, and such that the front gate region of this memory cell is shared by a memory cell adjacent in the row direction. Furthermore, in the present memory cell array, memory cells are configured such that the source region of each memory cell is shared by a memory cell adjacent in the column direction and such that the drain region of this memory cell is shared by a memory cell adjacent in the column direction. The FG lines and the SL lines extend in the row direction and each FG line is in contact with front gate regions of respective memory cells in a particular corresponding row, while each SL line is in contact with drain regions of respective memory cells in a particular corresponding row. The BG lines and the BL lines extend in the column direction and each BG line is in contact with back gate regions of respective memory cells in a particular corresponding column, while each BL line is in contact with drain regions of respective memory cells in a particular corresponding column.

In the configuration according to the second embodiment, as described above, each source region, each drain region, each front gate region, and each back gate region are shared by adjacent memory cells, and thus a further reduction in the total area of the memory cell array composed of memory cells is achieved compared with the memory cell array shown in FIG. 4A.

If one of the BL lines extending in the column direction is activated, a voltage is applied between the source region and the drain region of two memory cells sharing this BL line. However, the front gate region of one the two memory cells is connected to one of the FG lines extending in the row direction, while the front gate region of the other one the two memory cells is connected to another different one of the FG lines. Thus, when one of the BL lines and one of FG lines are activated, only one memory cell located at the intersection of the activated BL line and FG line can be connected to both the activated BL line and FG line, and this only one memory cell is activated.

In the reading operation, the FG line is at a negative voltage, and thus information stored in the activated memory cell is read.

On the other hand, in the writing operation, the voltage applied to the BG line is set to the negative voltage or 0 V depending on the state into which the memory cell is to be brought. Because the back gate region connected to the activated BG line is shared by two adjacent memory cells, the voltage is applied to the back gate region of memory cells located in two adjacent columns. However, to write data in a memory cell, it is required that a voltage must be applied between the source region and the drain region of this memory cell and a voltage must be applied to the gate region so that a current flows between the source region and the drain region. Thus, of memory cells whose back gate region is applied with the voltage, writing is performed only for the memory cell whose drain region and front gate region are applied with the voltages via the activated BL line and FG line. Therefore, although each back gate region is shared by two adjacent memory cells, multiple selection of memory cells does not occur in the reading and writing operations.

Thus, the memory cell array according to the second embodiment can be configured so as to have a high device density without causing a problem with multiple selections, and thus the memory cell array according to the second embodiment is advantageous for use as a memory embedded in an LSI.

Third Embodiment

Figure 13:
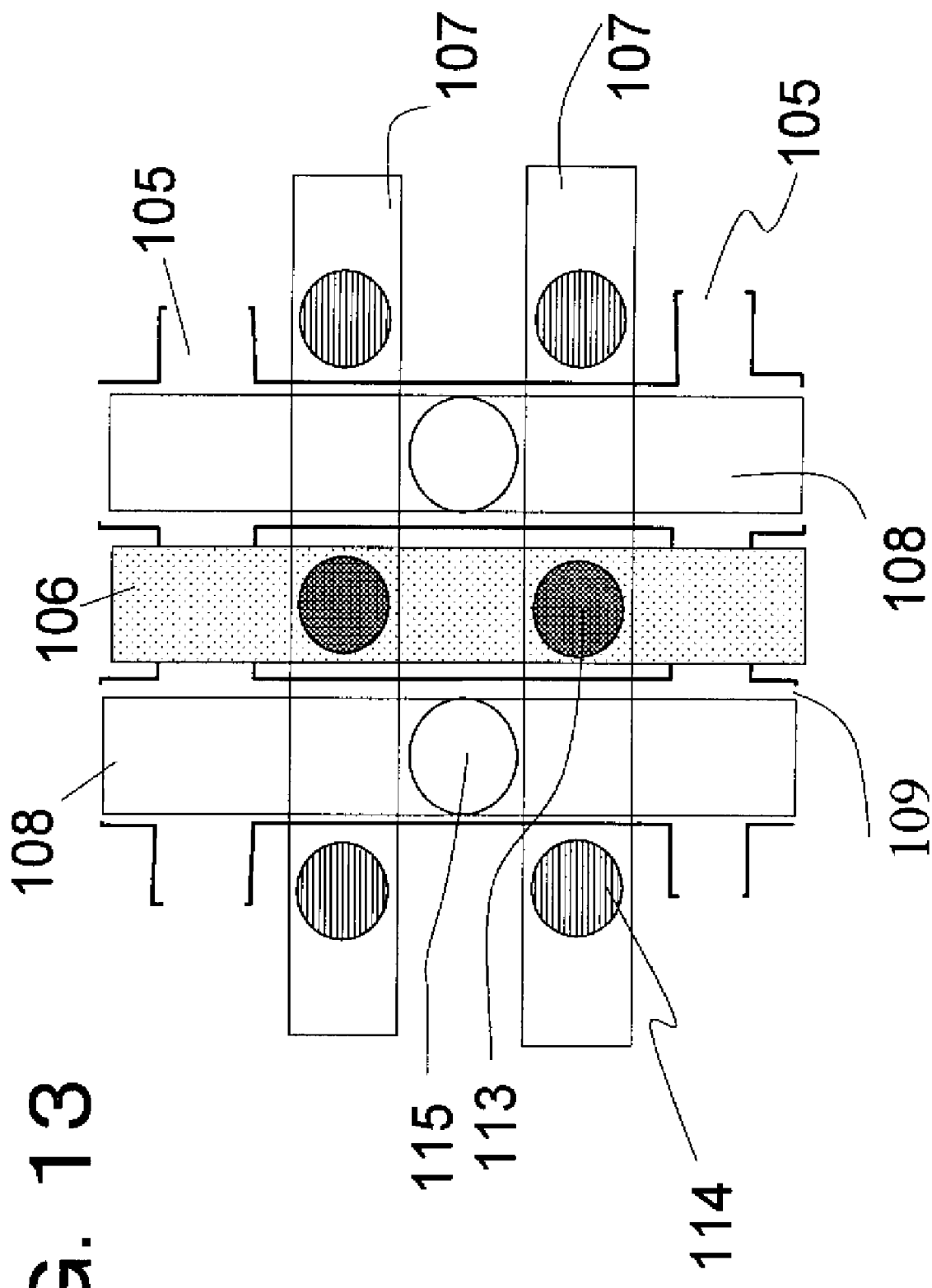
FIG. 13 is a plan view of a memory cell array according to an embodiment of the present invention.

Referring to FIG. 13, a memory cell array according to a third embodiment of the present invention is described below. The memory cell array according to the third embodiment is composed of memory cells which are similar to those according to the second embodiment except that fin regions in which memory cells are formed are connected in drain regions of memory cells adjacent in the row direction.

FIG. 13 shows a plan view of the memory cell array according to the third embodiment of the present invention. In FIG. 13, reference numerals 105 denote SL lines, reference numeral 106 denotes a BG line, reference numerals 107 denote FG lines, reference numerals 108 denote BL lines, reference numeral 109 denotes a 3-dimensional isolated region of silicon called a fin region in which a memory cell is formed, reference numeral 113 denotes a contact hole for contact with a corresponding back gate region of a memory cell (hereinafter such a contact hole will be referred to as a BG contact hole), reference numeral 114 denotes a contact hole for contact with a corresponding front gate region of a memory cell (hereinafter such a contact hole will be referred to as an FG contact hole), and reference numeral 115 denotes a contact hole for contact with a corresponding drain region of a memory cell (hereinafter such a contact hole will be referred to as a BL contact hole).

The fin region 109 is formed of silicon in the shape of an isolated region on a BOX layer of an SOI substrate. In the configuration according to the present embodiment, unlike the fin region shown in FIG. 9 formed of silicon in the shape of the isolated rectangular parallelepiped whose long sides simply extend in the column direction, the fin regions similar to those shown in FIG. 9 are partially connected to each other such that source regions of respective memory cells formed in one fin region are connected to source regions of respective memory cells formed in fin regions adjacent in the row direction. That is, the fin region 109 is formed of silicon in the shape of a single lattice.

Note that in the fin region 109, memory cells are disposed in a similar manner to the manner in which memory cells are disposed in the memory cell array shown in FIG. 9 such that memory cells are continuously formed in the column direction so as to form linear arrays of memory cells.

That is, source regions and drain regions of memory cells are formed on the top surface of the fin region 109 and a drain region and a source drain are alternately disposed along each lattice line in the column direction. The source regions are located at respective intersections of the lattice. Thus, each memory cell shares a source region or a drain region with a memory cell adjacent in the column direction, is connected to a memory cell adjacent in the row direction via an SL line 115 formed on the top surface of the fin region 109.

The front gate region of each memory cell is formed on one of side surfaces of the fin region 109 such that the drain region and the source region of the memory cell are separated by the front gate region. The back gate region of each memory cell is formed on the opposite side surface of the fin region 109 such that the drain region and the source region of the memory cell is separated by the back gate region. The front gate region and the back gate region of each memory cell are in contact with respect side surfaces of the fin region 109 via a gate insulating film. Each memory cell shares the front gate region with a memory cell adjacent in the row direction.

Each SL line 105 connects together source regions of respective memory cells formed on the top surface of the fin region 109 along a row. The SL lines 105 are realized, for example, by an impurity diffusion layer formed on the top surface of the fin region 109.

Each BG line 106 extends in the column direction and connects together, via BG contact holes 111, back gate regions of respective memory cells along a column. As with the memory cell array shown in FIG. 9, the BG lines 106 are realized by metal interconnection lines such as tungsten (W) interconnection lines. In the case where the SL lines 105 are realized by the impurity diffusion layer, the BG lines 106 are formed in the first interconnection layer.

Each FG line 107 extends in the row direction and connects together, via FG contact holes 114, front gate regions of respective memory cells along a row. As with the memory cell array shown in FIG. 9, the FG lines 107 are realized by metal interconnection lines such as tungsten (W) interconnection lines. In the case where the SL lines 105 are realized by the impurity diffusion layer, the FG lines 107 are formed in the second interconnection layer.

Each BL line 108 extends in the column direction and connects together, via BL contact holes 115, drain regions of respective memory cells along a column. As with the memory cell array shown in FIG. 9, the SL lines 108 are realized by metal interconnection lines such as tungsten (W) interconnection lines. In the case where the SL lines 105 are realized by the impurity diffusion layer, the BL lines 108 are formed in the third interconnection layer.

As described above, the memory cell array according to the third embodiment is different from the memory cell array according to the second embodiment in that the SL lines 105 are formed in an integral form on the top surface of the fin region 109. Thus, in the memory cell array according to the third embodiment of the present invention, as a result of sharing of the source region or the drain region by adjacent memory cells and sharing of front gate region or the back gate region by adjacent memory cells, a reduction in the total area of the memory cell array is achieved, as with the memory cell array shown in FIG. 9. Furthermore, interconnection lines can be formed using interconnection layers whose number is smaller by one.

Fourth Embodiment

Semiconductor Memory Device Using Memory Cell Array

A semiconductor memory device using the memory cell array according to the first embodiment, the second embodiment, or the third embodiment is described below with reference to FIGS. 14 and 15, and an LSI using such a semiconductor memory device as an embedded memory is further described with reference to FIG. 16.

Figure 14:
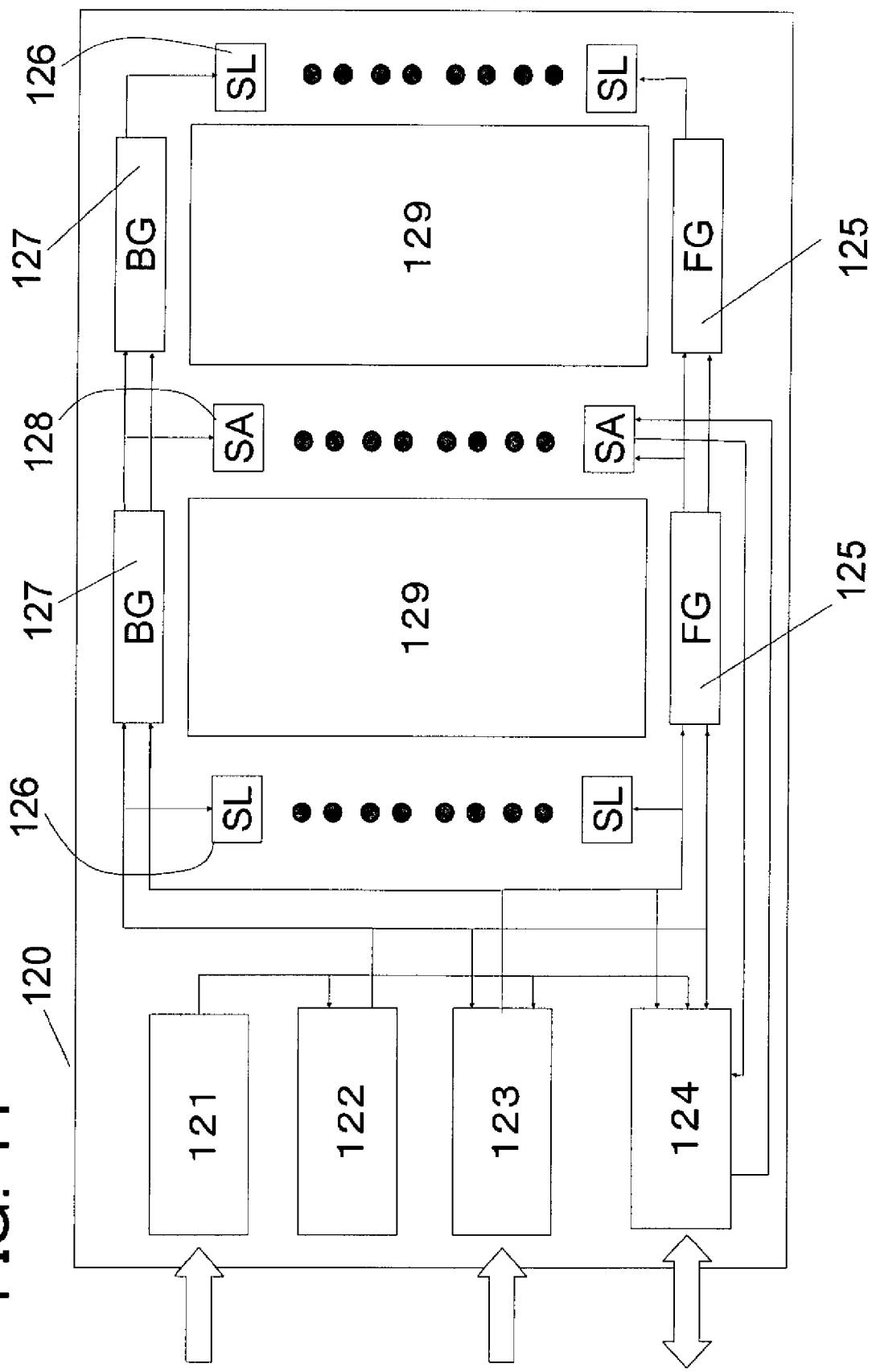
FIG. 14 is a circuit block diagram of a semiconductor memory device using a memory cell array according to an embodiment of the present invention.

FIG. 14 is a circuit block diagram of a semiconductor memory device using the memory cell array according to the first embodiment. In FIG. 14, reference numeral 120 denotes the semiconductor memory device, reference numeral 121 denotes a mode control circuit, reference numeral 122 denotes a control circuit, reference numeral 123 denotes an address resister, reference numeral 124 denotes a data input/output circuit, reference numerals 125 denote FG line selection circuits, reference numeral 126 denote SL line selection circuits, reference numerals 127 denote BG line selection circuits, reference numerals 128 denote sense amplifiers, and reference numerals 129 denote memory cell arrays.

The mode control circuit 121 receives a plurality of command signals input to the semiconductor memory device 120 and outputs a control mode signal specifying a control mode indicated by a combination of the plurality of command signals to the control circuit 122, the address resister 123, and the data input/output circuit 124.

If the control circuit 122 receives the control mode signal, the control circuit 122 outputs a control signal according to the received control mode signal to the address resister 123, the data input/output circuits 124, the FG line selection circuits 125, the SL line selection circuits 126, the BG line selection circuits 127, and the sense amplifiers 128.

If the address resister 123 receives a plurality of address signals input to the semiconductor memory device 120, the address resister 123 amplifies the received address signals and outputs them to the FG line selection circuits 125, the SL line selection circuits 126, the BG line selection circuits 127, and the sense amplifiers 128.

If the data input/output circuit 124 receives a plurality of data input to the semiconductor memory device 120, the data input/output circuit 124 transfers the input data to the sense amplifiers 128. If the data input/output circuit 124 receives data output from the sense amplifiers 128, the data input/output circuit 124 transfers them to the semiconductor memory device 120.

Each FG line selection circuit 125 is configured to select a particular one of the FG lines of corresponding one of the memory cell arrays 129 in accordance with the address signal. Each FG line selection circuit 125 is disposed at a location opposing, via the memory cell array 129, the corresponding BG line selection circuit 127.

Each SL line selection circuit 126 is configured to select a particular one of the FL lines of the corresponding one of memory cell arrays 129 in accordance with the address signal. Each SL line selection circuit 126 is disposed at a location opposing, via one of memory cell arrays 129, the corresponding sense amplifier 128.

Each BG line selection circuit 127 is configured to select a particular one of the BG lines of the corresponding one of the memory cell arrays 129 in accordance with the address signal. Each BG line selection circuit 127 is disposed at a location opposing, via the corresponding one of the memory cell arrays 129, the corresponding one of the FG line selection circuits 125.

Each sense amplifier 128 is selected in accordance with the address signal, and amplifies a voltage of a BL line of the memory cell array 128. When the control signal specifies the read mode, the amplified signal is output to the data input/output circuit 124. On the other hand, when the control signal specifies the write mode, the input signal from the data input/output circuit 124 is output to the BL line. Each sense amplifier 128 is disposed at a location opposing, via the corresponding one of the memory cell arrays 129, corresponding one of the SL line selection circuits 126.

In the semiconductor memory device 120 shown in FIG. 14, the FG line selection circuits 125 are located at the ends of FG lines extending in the memory cell arrays 129, and BG line selection circuits 127 are located at the ends of the BG lines extending in the memory cell arrays 129. Furthermore, in this semiconductor memory device 120, the SL line selection circuits are located at the ends of the SL lines extending in the memory cell arrays 129, and the sense amplifiers 128 are located at the ends of the BL lines extending in the memory cell arrays 129.

Thus, in this semiconductor device 120 shown in FIG. 14, connections between the FG lines and the FG line selection circuits 125, between the BG lines and the BG line selection circuits 127, between the SL lines and the SL line selection circuits, and between BL lines and sense amplifiers are achieved so as to minimize the distances thereof.

Figure 15:
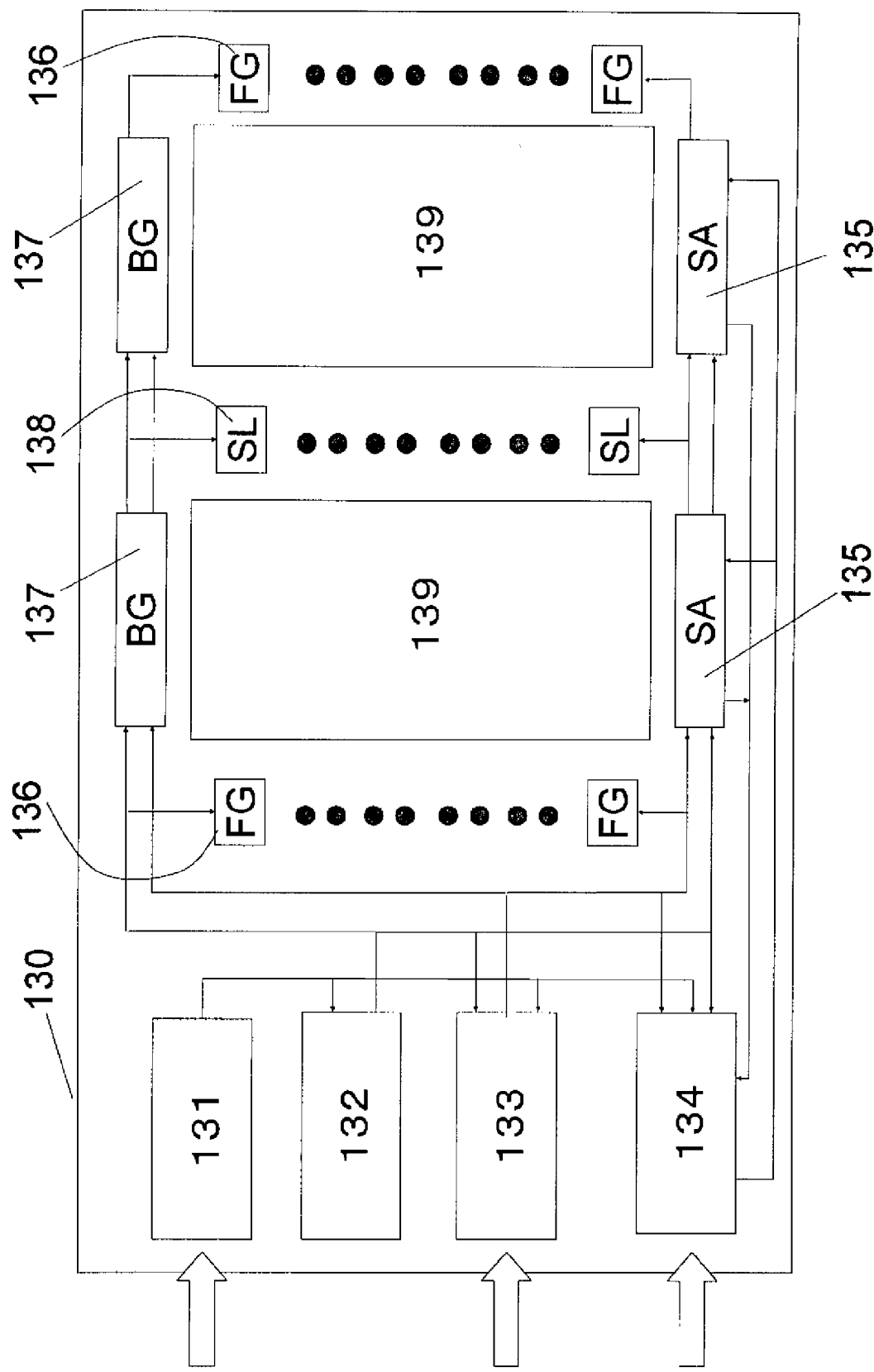
FIG. 15 is a circuit block diagram of a semiconductor memory device using a memory cell array according to an embodiment of the present invention.

FIG. 15 is a circuit block diagram of a semiconductor memory device using the memory cell array according to the second or third embodiment. In FIG. 15, reference numeral 130 denotes the semiconductor memory device, reference numeral 131 denotes a mode control circuit, reference numeral 132 denotes a control circuit, reference numeral 133 denotes an address resister, reference numeral 134 denotes a data input/output circuit, reference numerals 135 denote sense amplifiers, reference numerals 136 denote FG line selection circuits, reference numerals 137 denote BG line selection circuits, reference numerals 138 denote SL line selection circuits, and reference numerals 139 denote memory cell arrays.

The mode control circuit 131 receives a plurality of command signals input to the semiconductor memory device 130 and outputs a control mode signal specifying a control mode indicated by a combination of the plurality of command signals to the control circuit 132, the address resister 133, and the data input/output circuit 134.

If the control circuit 132 receives the control mode signal, the control circuit 132 outputs a control signal according to the received control mode signal to the address resister 133, the data input/output circuits 134, the FG line selection circuits 136, the SL line selection circuits 138, the BG line selection circuits 137, and the sense amplifiers 135.

If the address resister 133 receives a plurality of address signals input to the semiconductor memory device 130, the address resister 133 amplifies the received address signals and outputs them to the FG line selection circuits 136, the SL line selection circuits 138, the BG line selection circuits 137, and the sense amplifiers 135.

If the data input/output circuit 134 receives a plurality of data input to the semiconductor memory device 130, the data input/output circuit 134 transfers the input data to the sense amplifiers 135. If the data input/output circuit 134 receives data output from the sense amplifiers 135, the data input/output circuit 134 transfers them to the semiconductor memory device 130.

Each FG line selection circuit 136 is configured to select a particular one of the FG lines of corresponding one of the memory cell arrays 139 in accordance with the address signal. Each FG line selection circuit 136 is disposed at a location opposing, via the corresponding one of the memory cell arrays 139, corresponding one of the SL line selection circuits 138.

Each SL line selection circuit 138 is configured to select a particular one of the SL lines of the corresponding one of the memory cell arrays 139 in accordance with the address signal. Each SL line selection circuit 138 is disposed at a location opposing, via the corresponding one of the memory cell arrays 139, the corresponding one of the FG line selection circuits 136.

Each BG line selection circuit 137 is configured to select a particular one of the BG lines of the corresponding one of the memory cell arrays 139 in accordance with the address signal. Each BG line selection circuit 137 is disposed at a location opposing, via one of memory cell arrays 139, the corresponding one of the sense amplifiers 135.

Each sense amplifier 128 is selected in accordance with the address signal, and amplifies a voltage of a BL line of the memory cell array 128. When the control signal specifies the read mode, the amplified signal is output to the data input/output circuit 134. On the other hand, when the control signal specifies the write mode, the input signal from the data input/output circuit 134 is output to the BL line. Each sense amplifier 128 is disposed at a location opposing, via one of the memory cell arrays 139, corresponding one of the BG line selection circuits 137.

In the semiconductor memory device 130 shown in FIG. 15, the FG line selection circuits 136 are located at the ends of FG lines extending in the memory cell arrays 139, and SL line selection circuits 138 are located at the ends of the SL lines extending in the memory cell arrays 139. Furthermore, in this semiconductor memory device 130, the BG line selection circuits 137 are located at the ends of the BG lines extending in the memory cell arrays 139, and the sense amplifiers 135 are located at the ends of the BL lines extending in the memory cell arrays 139.

Thus, in this semiconductor device 130 shown in FIG. 15, connections between the FG lines and the FG line selection circuits 136, between the BG lines and the BG line selection circuits 137, between the SL lines and the SL line selection circuits 138, and between BL lines and sense amplifiers are achieved so as to minimize the distances thereof.

Figure 16:
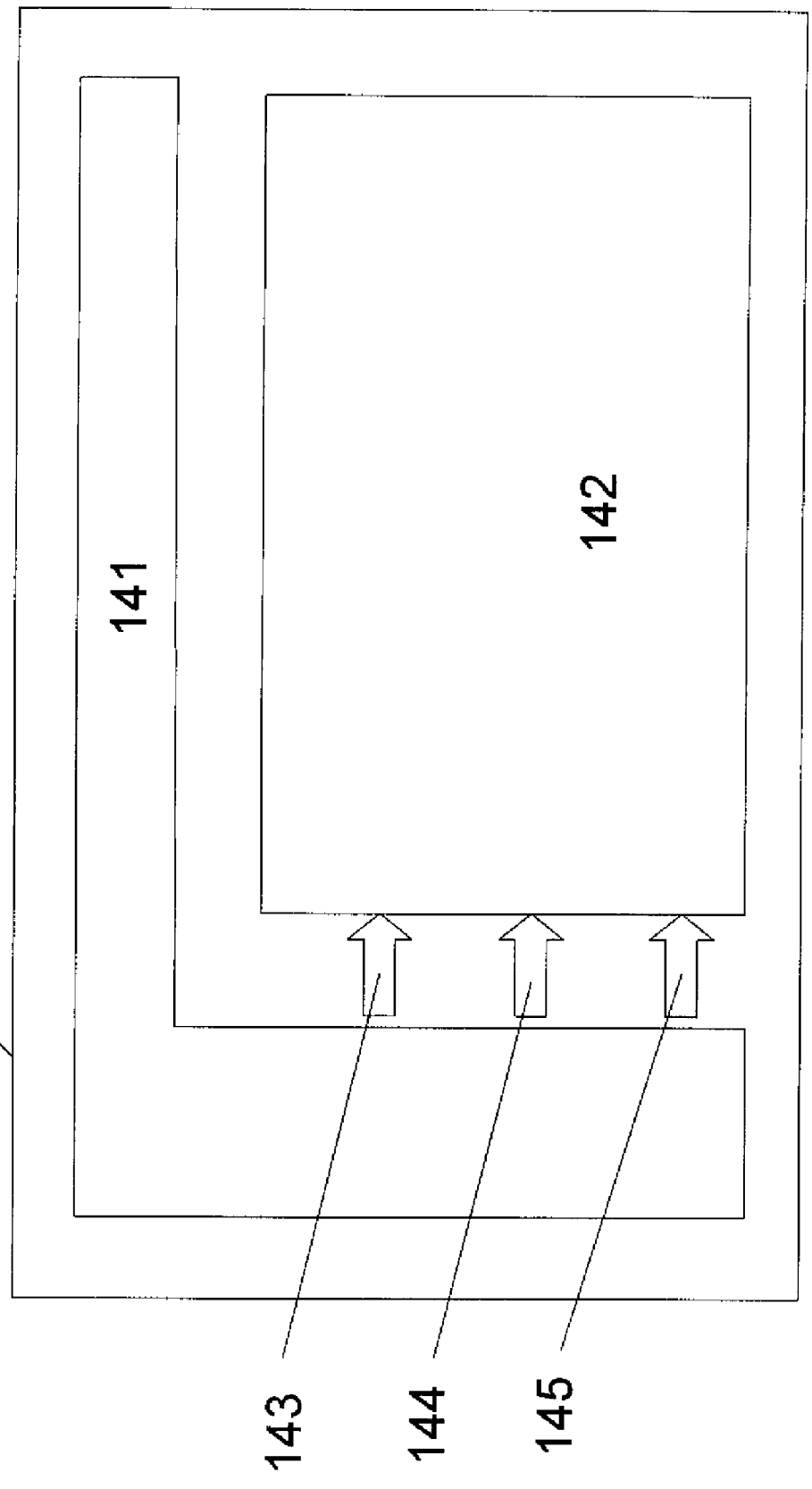
FIG. 16 is a diagram showing an LSI including a semiconductor memory device as an embedded memory according to an embodiment of the present invention.

FIG. 16 shows an LSI using the semiconductor memory device shown in FIG. 14 or the semiconductor memory device shown in FIG. 15 as an embedded memory.

In FIG. 16, reference numeral 140 denotes the LSI, reference numeral 141 denotes a logic circuit, reference numeral 142 denotes the embedded memory realized using the semiconductor memory device shown in FIG. 14 or the semiconductor memory device shown in FIG. 15, reference numeral 143 denotes a control signal, reference numeral 144 denotes an address signal, and reference numeral 145 denotes input/output data. The embedded memory 142 operation in accordance with the control signal 143 and the address signal 144 supplied from the logic circuit 141, and data is transferred between the embedded memory 142 and the logic circuit 141. Note that the logic circuit 141 may be formed using fin-FETs.

Use of the high-density embedded memory 142 allows the LSI 140 shown in FIG. 16 to have a high integration density.

What is claimed is:

1. A memory cell array comprising:
    semiconductor regions disposed on a supporting insulating substrate, each semiconductor region having a first side surface, a second side surface, and a top surface, the first side surface being opposite to the second side surface;
    memory cells formed in the semiconductor regions, the memory cells being arranged in the form of an array; and
    insulating regions formed between adjacent the semiconductor regions so as to insulate each semiconductor region;
    wherein each memory cell formed in a corresponding semiconductor region comprises:
        a source region disposed in the semiconductor region, the source region including the top surface of the semiconductor region;
        a drain region disposed in the semiconductor region, the source region including the top surface of the semiconductor region;
        a front gate region formed on a gate insulating film formed on the first side surface of the semiconductor region such that the source region and the drain region are separated from each other by the front gate region; and
        a back gate region formed on a gate insulating film formed on the second side surface of the semiconductor region such that the source region and the drain region are separated from each other by the back gate region,
    wherein the each memory cell shares the source region or the drain region with a adjacent memory cell, the adjacent memory cell being formed in the same semiconductor region including the each memory cell,
    wherein the each memory cell shares the back gate region with a memory cell in the adjacent semiconductor region in a first direction.

2. A memory cell array comprising:
    first linear arrays of first semiconductor regions arranged in a second direction on a supporting insulating substrate, each first semiconductor region having a first side surface, a second side surface, and a top surface, the first side surface being opposite to the second side surface;
    memory cells formed on respective first semiconductor regions;
    second linear arrays of second semiconductor regions arranged in the second direction on the supporting insulating substrate;
    insulating regions formed between adjacent first semiconductor regions, between respective first semiconductor regions and respective adjacent second semiconductor regions, and between respective second semiconductor regions so as to insulate each first semiconductor region and each second semiconductor;
    front gate lines;
    back gate lines;
    bit lines; and
    source lines,
    two first linear arrays of first semiconductor regions and one second linear array of second semiconductor regions being arranged periodically in a first direction,
    wherein each memory cell comprises:
        a source region disposed in the semiconductor region, the source region including the top surface of a corresponding first semiconductor region;
        a drain region disposed in the semiconductor region, the source region including the top surface of the first semiconductor region;
        a front gate region formed on a gate insulating film formed on a first side surface of the first semiconductor region, the front gate region being located between the first semiconductor region and the second semiconductor region, the front gate region being formed such that the source region and the drain region are separated from each other by the front gate region; and
        a back gate region formed on a gate insulating film formed on a second side surface of the first semiconductor region, second side surface being located opposite to the first side surface, the back gate region being located between the first semiconductor region and the adjacent first semiconductor region, the back gate region being formed such that the source region and the drain region are separated from each other by the back gate region,
    wherein the each memory cell shares the back gate region with a memory cell in the adjacent first semiconductor region in a first direction,
    each front gate line extending in the second direction and being in contact with the front gate regions of the memory cells located along a line in the second direction,
    wherein each memory cell shares the source region or the drain region with a adjacent memory cell in the second direction, the adjacent memory cell being formed in the first semiconductor region including the each memory cell,
    wherein each back gate line extends in the second direction and being in contact with the back gate regions of the memory cells located along a line extending in the second direction,
    wherein each bit line extends in the first direction and being in contact with the drain regions of the memory cells located along a line extending the first direction,
    wherein each source line extends in the first direction and being in contact with the source regions of the memory cells located along a line extending in the first direction.

3. The memory cell array according to claim 2, comprising the steps of:
    the front gate lines and the back gate lines are formed with a first interconnection layer; and
    forming the bit lines and the source lines are formed with a second interconnection layer.

4. The memory cell array according to claim 3, wherein the first interconnection layer is a poly-silicon layer and the second interconnection layer is a metal layer.

5. A semiconductor circuit device for operating the memory cell array according to claim 2, the device comprising:
   sense amplifiers connected to the bit lines;
   a first selection circuit configured to select one of the source lines;
   a second selection circuit configured to select one of the front gate lines; and
   a third selection circuit configured to select one of the back gate lines,
   the sense amplifiers and the first selection circuit being disposed such that the memory cell array is located between the sense amplifiers and the first selection circuit,
   the second selection circuit and the third selection circuit being disposed such that the memory cell array is located between the second selection circuit and the third selection circuit.

6. A memory cell array comprising:
   isolated semiconductor regions formed on a supporting insulating substrate so as to extend in a second direction, each isolated semiconductor region having a first side surface, a second side surface, and a top surface, the first side surface being opposite to the second side surface;
   a plurality of memory cells formed continuously in the second direction in the respective semiconductor regions;
   insulating regions formed between adjacent isolated semiconductor regions thereby insulating each isolate semiconductor region;
   front gate lines;
   back gate lines;
   bit lines;
   source lines,
   the semiconductor regions being arranged in a first direction so as to form the memory cell array,
   wherein each memory cell comprises:
      a source region disposed in the semiconductor region, the source region including the top surface of a corresponding isolated semiconductor region;
      a drain region disposed in the semiconductor region, the source region including the top surface of the corresponding isolated semiconductor region;
      a front gate region formed on a gate insulating film formed on a first side surface of the isolated semiconductor region such that the source region and the drain region are separated from each other by the front gate region; and
      a back gate region formed on a gate insulating film formed on a second side surface of the isolated semiconductor region, the second side surface being located opposite to the first side surface, the back gate region being formed such that the source region and the drain region are separated from each other by the back gate region,
   wherein each memory cell shares the source region or the drain region with a adjacent memory cell in the second direction, the adjacent memory cell being formed in the isolated semiconductor region including the each memory cell,
   wherein each memory cell shares the front gate region or the back gate region with a memory cell in the adjacent isolated semiconductor region in the first direction,
   wherein each front gate line extends in the second direction and being in contact with front gate regions of memory cells in the semiconductor regions located along a line extending in the second direction,
   wherein each back gate line extends in the first direction and being in contact with back gate regions of respective memory cells located along a line extending in the first direction,
   wherein each bit line extends in the second direction and being in contact with drain regions of memory cells in respective semiconductor regions located along a line extending in the second direction,
   wherein each source line extends in the first direction and being in contact with source regions of respective memory cells located along a line extending in the first direction.

7. The memory cell array according to claim 6, comprising:
   the source lines are formed with a first interconnection layer;
   the back gate lines formed with a second interconnection layer;
   the front gate lines formed with a third interconnection layer; and
   the bit lines formed with a fourth interconnection layer.

8. The memory cell array according to claim 7, wherein the first interconnection, the second interconnection layer, the third interconnection layer, and the fourth interconnection layer are metal layers.

9. A semiconductor circuit device for operating the memory cell array according to claim 6, the device comprising:
   sense amplifiers connected to the respective bit lines;
   a first selection circuit configured to select one of the source lines;
   a second selection circuit configured to select one of the front gate lines; and
   a third selection circuit configured to select one of the back gate lines,
   the sense amplifiers and the second selection circuit being disposed such that the memory cell array is located between the sense amplifiers and the second selection circuit,
   the first selection circuit and the third selection circuit being disposed such that the memory cell array is located between the first selection circuit and the third selection circuit.

10. A memory cell array comprising:
    semiconductor regions formed on a supporting insulating substrate, the semiconductor regions being arranged in the form of a lattice, each semiconductor region having a first side surface, a second side surface, and a top surface, the first side surface being opposite to the second side surface;
    a plurality of memory cells formed in the respective semiconductor regions, the memory cells being arranged in the form of an array;
    insulating regions formed between adjacent semiconductor regions so as to insulate each semiconductor region;
    front gate lines;
    back gate lines;
    bit lines; and
    source lines,
    wherein each memory cell comprises:
       a source region formed in the semiconductor region, the source region including the top surface of a semiconductor region at an intersection of the lattice;

a drain region formed in the semiconductor region, the source region including the top surface the semiconductor region at the intersection of the lattice;

a front gate region formed on a gate insulating film formed on a first side surface of the semiconductor region such that the source region and the drain region are separated from each other by the front gate region; and a back gate region formed on a gate insulating film formed on a second side surface of the semiconductor region, the second side surface being located opposite to the first side surface, the back gate region being formed such that the source region and the drain region are separated from each other by the back gate region, wherein each memory cell shares the source region or the drain region with a adjacent memory cell in the first direction, the adjacent memory cell being formed in the semiconductor region including the each memory cell, wherein each memory cell shares the front gate region or the back gate region with a memory cell in the adjacent semiconductor region in the second direction, wherein each front gate line extends in the first direction and being in contact with front gate regions of memory cells in respective semiconductor regions located along a line extending in the first direction, wherein each back gate line extends in the second direction and being in contact with back gate regions of respective memory cells located along a line extending in the second direction;

wherein each bit line extends in the first direction and being in contact with drain regions of memory cells in respective semiconductor regions located along a line extending in the first direction, wherein each source line extends in the row direction and being in contact with source regions formed on the top semiconductor regions of respective memory cells located in one row, the source regions being located along a lattice line extending in the second direction.

11. The memory cell array according to claim 10, comprising:

the source lines are formed with an impurity diffusion layer on the semiconductor regions;

the back gate lines are formed with a first interconnection layer;

the front gate lines are formed with a second interconnection layer; and the bit lines formed with a third interconnection layer.

12. The memory cell array according to claim 11, wherein the first interconnection, the second interconnection layer, and the third interconnection layer are metal layers.

13. A semiconductor circuit device for operating the memory cell array according to claim 10, the device comprising:

sense amplifiers connected to the respective bit lines;

a first selection circuit configured to select one of the source lines;

a second selection circuit configured to select one of the front gate lines; and a third selection circuit configured to select one of the back gate lines, the sense amplifiers and the second selection circuit being disposed such that the memory cell array is located between the sense amplifiers and the second selection circuit, the first selection circuit and the third selection circuit being disposed such that the memory cell array is located between the first selection circuit and the third selection circuit.

14. A semiconductor device using the semiconductor circuit device according to claim 13, the semiconductor device comprising:

logic circuits generating a control signal, an address signal, input/output data to control the semiconductor circuit device.

* * * * *